United States Patent
Naumenko et al.

(10) Patent No.: US 7,446,453 B1
(45) Date of Patent: Nov. 4, 2008

(54) SURFACE ACOUSTIC WAVE DEVICES USING SURFACE ACOUSTIC WAVES WITH STRONG PIEZOELECTRIC COUPLING

(75) Inventors: Natalya F. Naumenko, Moscow (RU); Benjamin P. Abbott, Longwood, FL (US)

(73) Assignee: TriQuint, Inc., Orlando, FL (US)

( * ) Notice: Subject to any disclaimer, the term of this patent is extended or adjusted under 35 U.S.C. 154(b) by 0 days.

(21) Appl. No.: 11/773,151

(22) Filed: Jul. 3, 2007

Related U.S. Application Data

(60) Provisional application No. 60/806,567, filed on Jul. 5, 2006.

(51) Int. Cl.
*H03H 9/25* (2006.01)
(52) U.S. Cl. .................... 310/313 A; 310/363
(58) Field of Classification Search ............. 310/313 A, 310/363
See application file for complete search history.

(56) References Cited

U.S. PATENT DOCUMENTS

| | | | |
|---|---|---|---|
| 6,556,104 | B2 | 4/2003 | Naumenko et al. |
| 6,661,313 | B2 | 12/2003 | Naumenko et al. |
| 6,791,237 | B2 | 9/2004 | Yamanouchi |
| 6,798,318 | B1 | 9/2004 | Abbott et al. |
| 6,833,744 | B2 * | 12/2004 | Yi .......................... 327/175 |
| 6,833,774 | B2 | 12/2004 | Abbott et al. |
| 6,861,927 | B1 | 3/2005 | Abbott et al. |
| 7,105,980 | B2 | 9/2006 | Abbott et al. |
| 7,213,314 | B2 | 5/2007 | Abbott et al. |
| 2007/0096592 | A1* | 5/2007 | Kadota et al. ........... 310/313 A |

OTHER PUBLICATIONS

Hashimoto, Ken-Ya; Asano, Hiroki; Matsuda, Kenji; Yokoyama, Naofumi; Omori, Tatsuya; Yamaguchi,Masatsune; "Wideband Love Wave Filters Operating in GHz Range on Cu-Grating/Rotated-YX-liNbO3-Substrate Structure"; 2004 IEEE International Ultrasonics, Symposium; pp. 1330-1334.

Isobe, A.; Hikita, M.; Asai, K.; Sumioka A.; "Grating-Mode-Type Wide-Band SAW Resonators for VCOs"; 1998 IEEE Ultrasonics Symposium; pp. 111-114.

* cited by examiner

*Primary Examiner*—Thomas M Dougherty
(74) *Attorney, Agent, or Firm*—Allen, Dyer, Doppelt, Milbrath & Gilchrist, P.A.

(57) ABSTRACT

A SAW device includes a $LiNbO_3$ single crystal piezoelectric substrate having an orientation defined by Euler angles ($\lambda, \mu, \theta$), with angle $\lambda$ ranging from $-5°$ to $+5°$, angle $\mu$ ranging from about $-74°$ to about $-65°$, and angle $\theta$ ranging from $-5°$ to $+5°$. Electrode patterns on a surface of the substrate form element resonators having a metallization ratio ranging from about 0.3 to about 0.8 and electrode thicknesses ranging from about 12% to about 17.5% of an acoustic wavelength of a strongly coupled non-leaky surface acoustic wave, excited on the surface of the substrate, if Al is used as electrode material, and in a range from about 6% to about 10% of an acoustic wavelength, if Cu is used as electrode material. Such orientations simultaneously combined with an optimized electromechanical coupling of spurious surface acoustic mode provide for improved performance in RF applications with a widened passband.

15 Claims, 24 Drawing Sheets

(a)

(b)

(a)

(b)

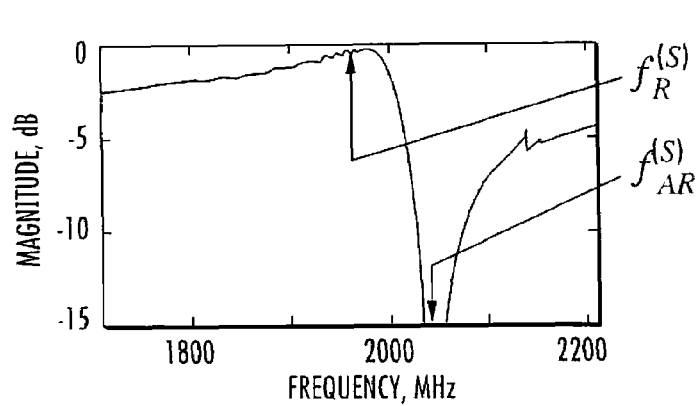
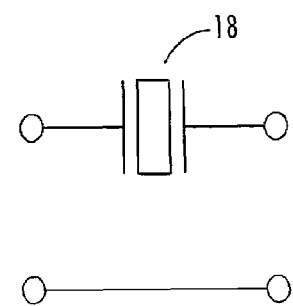
FIG. 16A
FIG. 16B
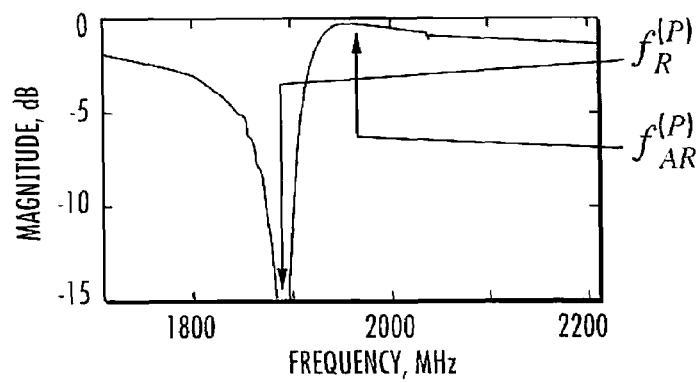
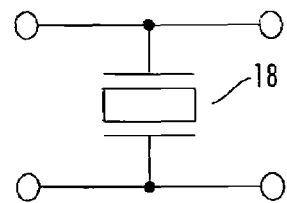
FIG. 17A
FIG. 17B

SURFACE ACOUSTIC WAVE DEVICES USING SURFACE ACOUSTIC WAVES WITH STRONG PIEZOELECTRIC COUPLING

CROSS-REFERENCE TO RELATED APPLICATIONS

This application claims the benefit of U.S. Provisional Application No. 60/806,567, filed Jul. 5, 2006, the disclosure of which is hereby incorporated by reference herein in its entirety, and commonly owned.

FIELD OF THE INVENTION

The present invention generally relates to surface acoustic wave (SAW) devices and more particularly to a SAW device having improved performance characteristics for application to RF filtering for wireless communications.

BACKGROUND

Surface acoustic wave (SAW) filters with resonant structures are extensively used for radio frequency (RF) filtering in wireless communication systems, due to small chip size and low insertion loss, which can be realized in such filters. The performance of RF filter depends upon the characteristics of SAW propagating in a piezoelectric substrate. In particular, the maximum passband width of a SAW filter is typically limited by electromechanical coupling coefficient.

SUMMARY

Embodiments of the invention provide a piezoelectric substrate with novel optimum orientation for use in high frequency (RF) SAW devices, which eliminate disadvantages of substrate orientations known to date.

An improved performance is provided for a SAW filter with a widened passband, while reducing ripples in the filter passband, in SAW filters comprising resonator-type elements, resulting from pre-selected orientations of $LiNbO_3$ with simultaneously optimized electrode thickness for suppression of spurious surface acoustic mode, which is excited on the surface of the piezoelectric substrate.

There is a need to provide substrate cuts with high squared electromechanical coupling $k^2$ of non-leaky SAW mode excited on the surface of a piezoelectric substrate (at least higher than 17%) and low coupling $k^2$ of spurious SAW mode (at least less than 0.075%) in the interval of thicknesses from 12% Λ to 17.5% Λ for an electrode pattern with aluminum (Al) as a primary component. Further, there is a need to find desirable substrate cuts with optimized electromechanical coupling of spurious SAW mode, when copper (Cu) is used as a primary component of electrode material, with electrode thickness in the range from 6% Λ to 10% Λ.

One embodiment of the present invention provides a SAW device comprising a piezoelectric substrate of a single crystal $LiNbO_3$ with an electrode pattern disposed on a surface of said piezoelectric substrate and forming resonator. A thickness of an electrode pattern may range from 12% to 17.5% Λ. Al may be used as a primary component of electrode material. Further, a piezoelectric substrate may have an orientation defined by the Euler angles ($\lambda$, $\mu$, $\theta$), with angle $\lambda$ in the range from $-5°$ to $+5°$, angle $\mu$ in the range from $-74°$ to $-65°$, and angle $\theta$ in the range from $-5°$ to $+5°$.

Another embodiment of the present invention provides a SAW device which may comprise a piezoelectric substrate of a single crystal $LiNbO_3$ with an electrode pattern disposed on a surface of said piezoelectric substrate and forming resonator. A thickness of the electrode pattern may range from 6% to 10% Λ. Cu may be used as a primary component of electrode material. A piezoelectric substrate may have an orientation defined by the Euler angles ($\lambda$, $\mu$, $\theta$), with angle $\lambda$ in the range from $-5°$ to $+5°$, angle $\mu$ in the range from $-74°$ to $-65°$, and angle $\theta$ in the range from $-5°$ to $+5°$.

By way of further example, one embodiment of a SAW device may comprise a piezoelectric substrate of a single crystal $LiNbO_3$ with an electrode pattern on a surface of the piezoelectric substrate, wherein the piezoelectric substrate has an orientation defined by Euler angles ($\lambda$,$\mu$,$\theta$), with angle $\lambda$ in the range from $-5°$ to $5°$, angle $\mu$ in a range from about $-74°$ to about $-65°$, and angle $\theta$ in a range from about $-5°$ to $5°$, and wherein the electrode pattern forms a resonator having metallization ratio in a range from about 0.3 to about 0.8. Optionally, a primary material of the electrode may comprise Al, wherein an electrode thickness ranges from 12% Λ to 17.5% Λ, where Λ is an acoustic wavelength of a surface acoustic wave excited on a said piezoelectric substrate and having strong piezoelectric coupling, or a primary material of the electrode may comprise Cu, and wherein electrode thickness ranges from 6% Λ to 10% Λ.

Embodiments of the present invention provide a filter with wide bandwidth and high performance, and reduce spurious resonance caused by parasitic SAW mode. By way of example and as herein described, SAW filters may comprise resonator-type elements, built on an optimal orientation of $LiNbO_3$ with Al or Cu grating of optimal thickness. The high performance of a wideband filter is provided due to high electromechanical coupling of Mode 1 and minimum coupling of Mode 2. Further, temperature compensated versions of these SAW filters may be provided. By way of example, the temperature compensation may be accomplished by bonding of $LiNbO_3$ wafer of optimal orientation, with optimal thickness of Al or Cu grating, to silicon, glass, Pyrex or another material, to obtain composite wafer with improved temperature stability.

BRIEF DESCRIPTION OF THE DRAWINGS

For a fuller understanding of the invention, reference is made to the following detailed description, taken in connection with the accompanying drawings illustrating various embodiments of the present invention, in which:

FIGS. 16A and 16B illustrate resonant and antiresonant frequency characteristics for an impedance element in a series configuration, and a symbolic illustration of such series element, respectively;

FIGS. 17A and 17B illustrate resonant and antiresonant frequency characteristics for an impedance element in a parallel configuration, and a symbolic illustration of such parallel element, respectively;

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
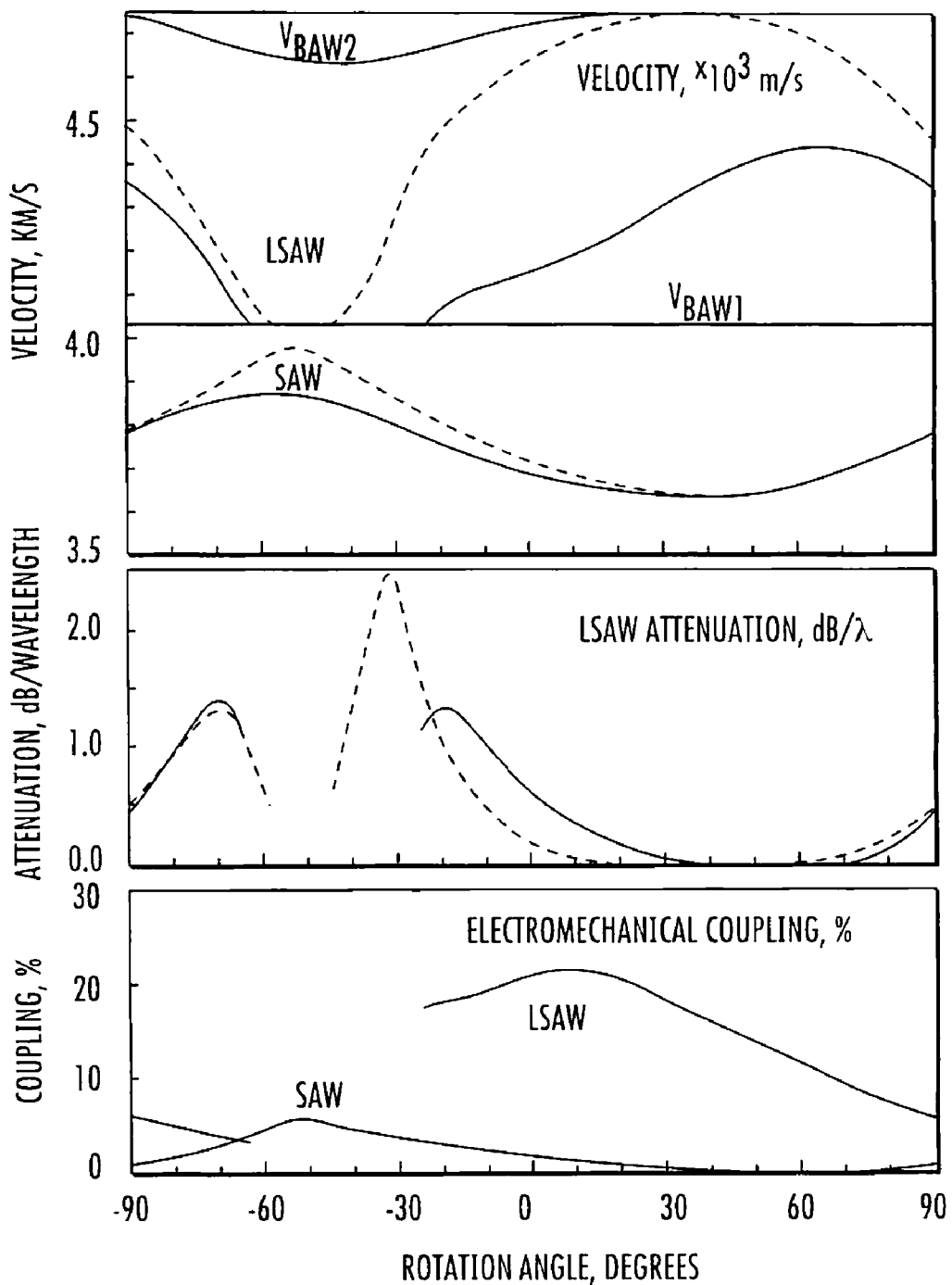
FIG. 1 graphically illustrates velocity, attenuation and electromechanical coupling coefficients of two modes propagating along X-axis in rotated Y-cuts of $LiNbO_3$, as functions of rotation angle with solid and dashed curves referring to open-circuit and short-circuit electrical boundary conditions, respectively.

By way of some introduction and example, rotated Y-cuts of $LiTaO_3$ single crystal are widely used as substrates of RF filters. Leaky surface acoustic waves (LSAW) can propagate with squared electromechanical coupling coefficient $k^2$ varying between 8% and 10%. Higher coupling coefficients, up to 23%, can be provided in SAW devices, which utilize LSAW propagating along X-axis in rotated Y-cuts (hereafter referred to as rotated YX-cuts) of $LiNbO_3$ single crystals, with rotation angles from −25° to 60°, as shown in FIG. 1, but application of these cuts in RF filters is restricted by LSAW attenuation caused by the nature of this type of waves. These and other calculations of the present invention were made with material constants of $LiNbO_3$ reported by Kushibiki (J. Kushibiki et al., IEEE Trans. Ultrason., Ferroelect., Freq. Control, 1999, v.46, No 5, pp. 1315-1323). If another set of material constants is used, the results do not change significantly.

With rotation angles varying between 35° and 65°, which provide sufficiently low attenuation of LSAW (less than 0.05 dB per wavelength), simultaneously for open-circuited and short-circuited electrical conditions, the coupling coefficient $k^2$ reaches maximum value of 17%. In practice, orientations with rotation angles close to 41° are not used in SAW filters because of very strong interaction between LSAW and bulk acoustic wave (BAW). Therefore, electromechanical coupling of commonly used orientations does not exceed 12%, which corresponds to maximum passband width of RF filter about 3-5%, depending upon the amount of rejection required of the filter.

Yamanouchi (U.S. Pat. No. 6,791,237 B2) illustrates that the propagation loss can be suppressed in rotated Y-cuts of $LiNbO_3$ with high electromechanical coupling, having rotation angles between −10 and +40 degrees, if uniform thin film, such as isotropic $SiO_2$ glass, is deposited on the substrate surface, with electrodes of interdigital transducer formed at the interface between the substrate and isotropic layer. For example, with normalized $SiO_2$ thickness $h/\lambda$ about 15% or larger, propagation loss tends to zero, due to transformation of leaky wave into SAW, with electromechanical coupling between 18 and 25%, dependent on the rotation angle of the substrate (reference should be made to FIG. 3 of Yamanouchi's patent).

Such layered structure can be implemented in wideband transversal filters. In resonator-type filters, the insertion loss of a device can be significantly decreased, if large values of the reflection coefficient from the periodic grating of metal electrodes are provided.

Figure 6A:
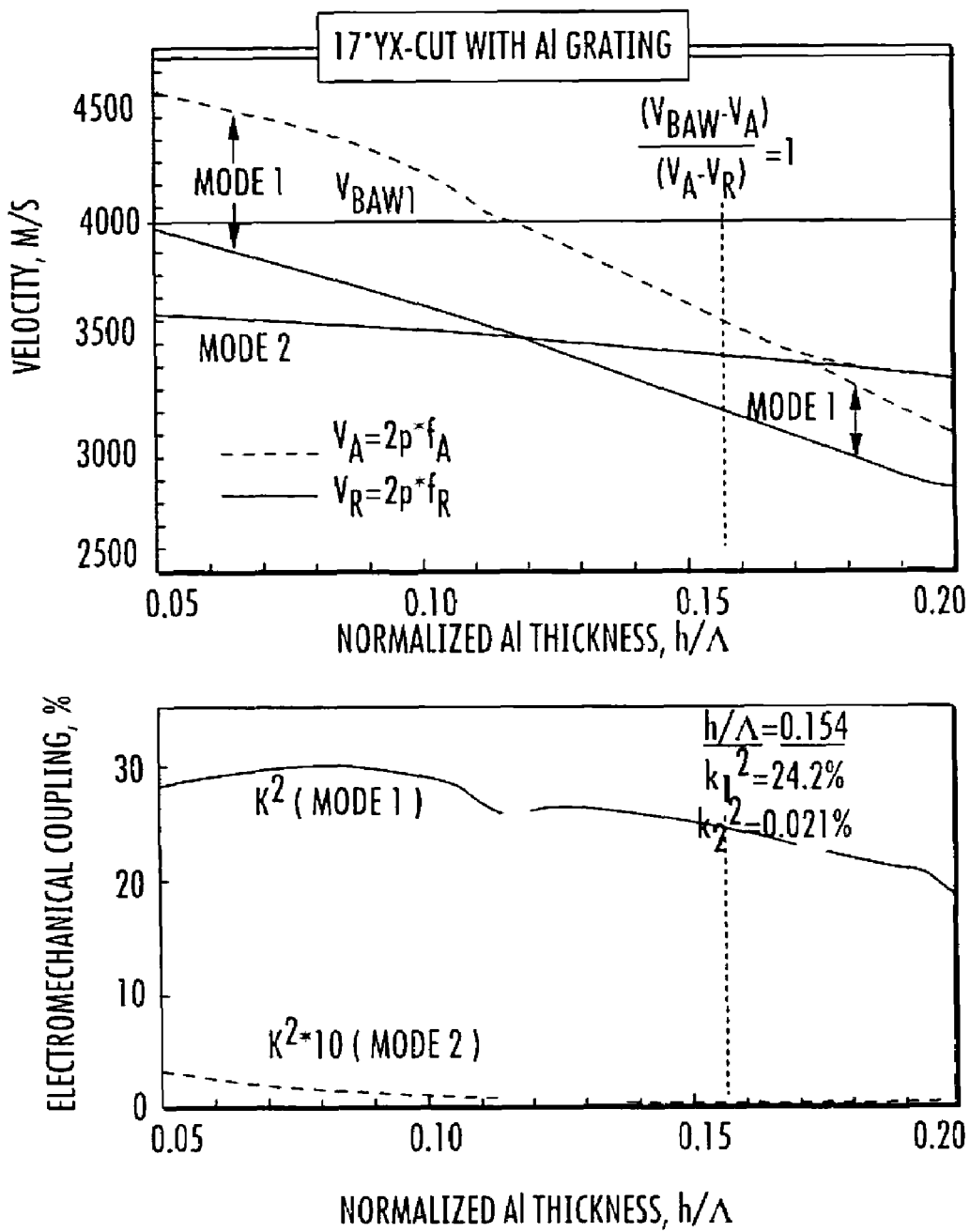
FIG. 6 graphically illustrates velocities of two modes, propagating in 17°-YX cut of $LiNbO_3$ with open-circuit and short-circuit grating, and electromechanical coupling coefficients of these modes, as functions of normalized electrode thickness h/2p: (a) Electrode material is Al; (b) Electrode material is Cu, wherein for the found optimal electrode thicknesses, electromechanical coupling coefficients of two modes are determined.

The reflection coefficient can be increased in the grating with heavy or thick electrodes. If the thickness of electrodes is sufficiently high, the propagation loss of leaky wave can be suppressed, without implementing of additional isotropic layer. This provides low propagation loss simultaneously with large reflection coefficient, and does not require additional stage of device fabrication process, to deposit dielectric film after building of electrode structure. Therefore, to enable high performance of SAW filter with such wider passbands, resonator structures with heavy electrodes deposited on rotated YX-cuts of $LiNbO_3$ can be used. Reference is made to H. Shimizu (H. Shimizu et al, Proc. 1990 IEEE Ultrasonics Symp., pp. 103-108), which reported that in 15°-rotated YX cut of $LiNbO_3$, with periodic grating of Au electrodes, the non-leaky SAW can propagate without attenuation. This wave is characterized by high electromechanical coupling of about 30%, if normalized thickness of electrodes is about 4.2% $\Lambda$, where $\Lambda=2p$ is SAW wavelength when the Bragg reflection condition is satisfied, and p is a periodicity of a grating. This orientation can be defined by the Euler angles (0°, −75°, 0°). In FIG. 6 of Shimizu's paper, the experimental impedance response of SAW resonator made on 15'-rotated YX cut is compared with experimental responses of resonators made on YX-cut and 10°-rotated YX cut. The spurious response, which is caused by Rayleigh-type mode, reduces with rotation angle and looks suppressed in 15'-rotated YX cut.

A. Isobe (A. Isobe et al, Proc. 1998 IEEE Ultrasonics Symp., 111-114) reported that 15°-rotated YX cut of $LiNbO_3$ can be utilized in SAW resonators with Al grating and bandwidths larger than 13%, if the normalized thickness of Al electrodes is about 13% $\Lambda$. K. Hashimoto (K. Hashimoto et al, Proc. 2004 Ultrasonics Symp., pp. 1330-1334) reported that the same orientation can be utilized in wideband resonator SAW filters with Cu grating, if the normalized thickness of Cu electrodes is about 7.5% $\Lambda$.

Figure 2:
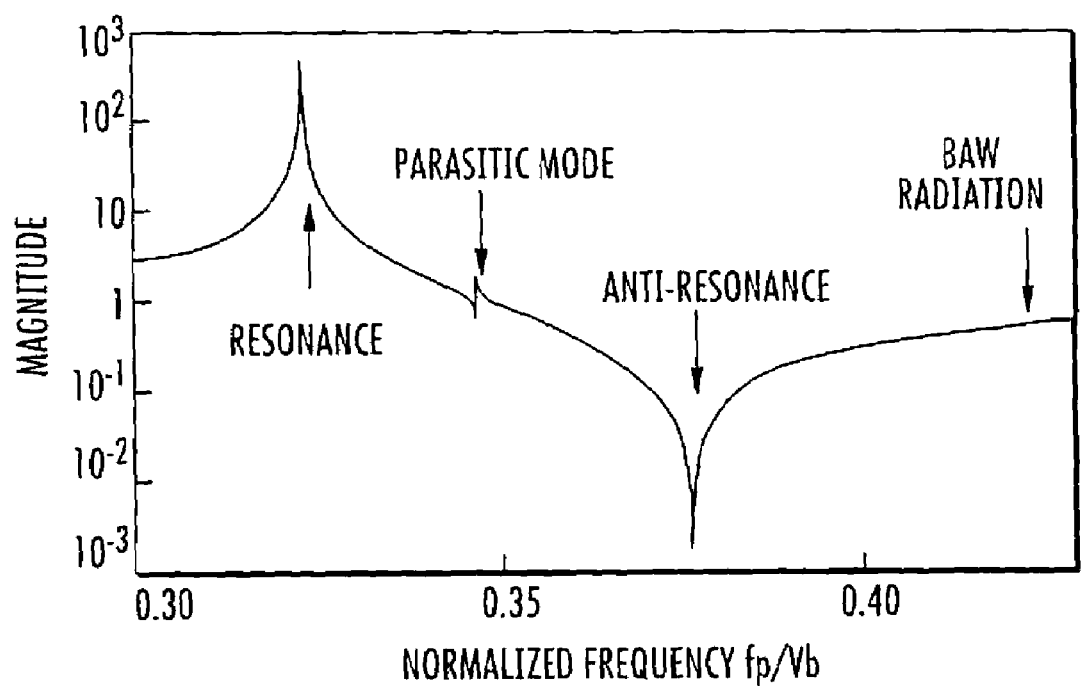
FIG. 2 graphically illustrates amplitude of strip admittance of infinite periodic Cu grating, with normalized thickness h=7.5% Λ and duty factor a/p=0.5, deposited on 15°-YX cut of $LiNbO_3$, wherein the admittance is shown as function of normalized frequency $f'=fp/V_{BAW}$, and where p is a period of a grating and $V_{BAW}$ is the bulk wave velocity.

FIG. 2 illustrates calculated admittance of infinite periodic Cu grating with normalized thickness 7.5% $\Lambda$ and metallization ratio (electrode width to periodicity ratio) $a/p=0.5$, on 15°-rotated YX cut of $LiNbO_3$. The admittance is shown as function of normalized frequency $f=fp/V_{BAW2}$, where $V_{BAW2}=4214.64$ m/s is the calculated velocity of the fast quasi-shear BAW propagating along the surface. The spurious Rayleigh-type mode disturbs the frequency response between resonant and anti-resonant frequencies. Though the piezoelectric coupling of this mode ($k^2=0.075\%$) is much lower than that of the non-leaky mode ($k^2=30\%$), it is expected to deteriorate the performance of SAW filter in the passband, as shown in Hashimoto's paper. For example, if propagation loss in the substrate material provides quality factor about 800, the peak to peak ripple about 1.5 dB, caused by parasitic mode, can be expected inside the filter passband.

Figure 3A:
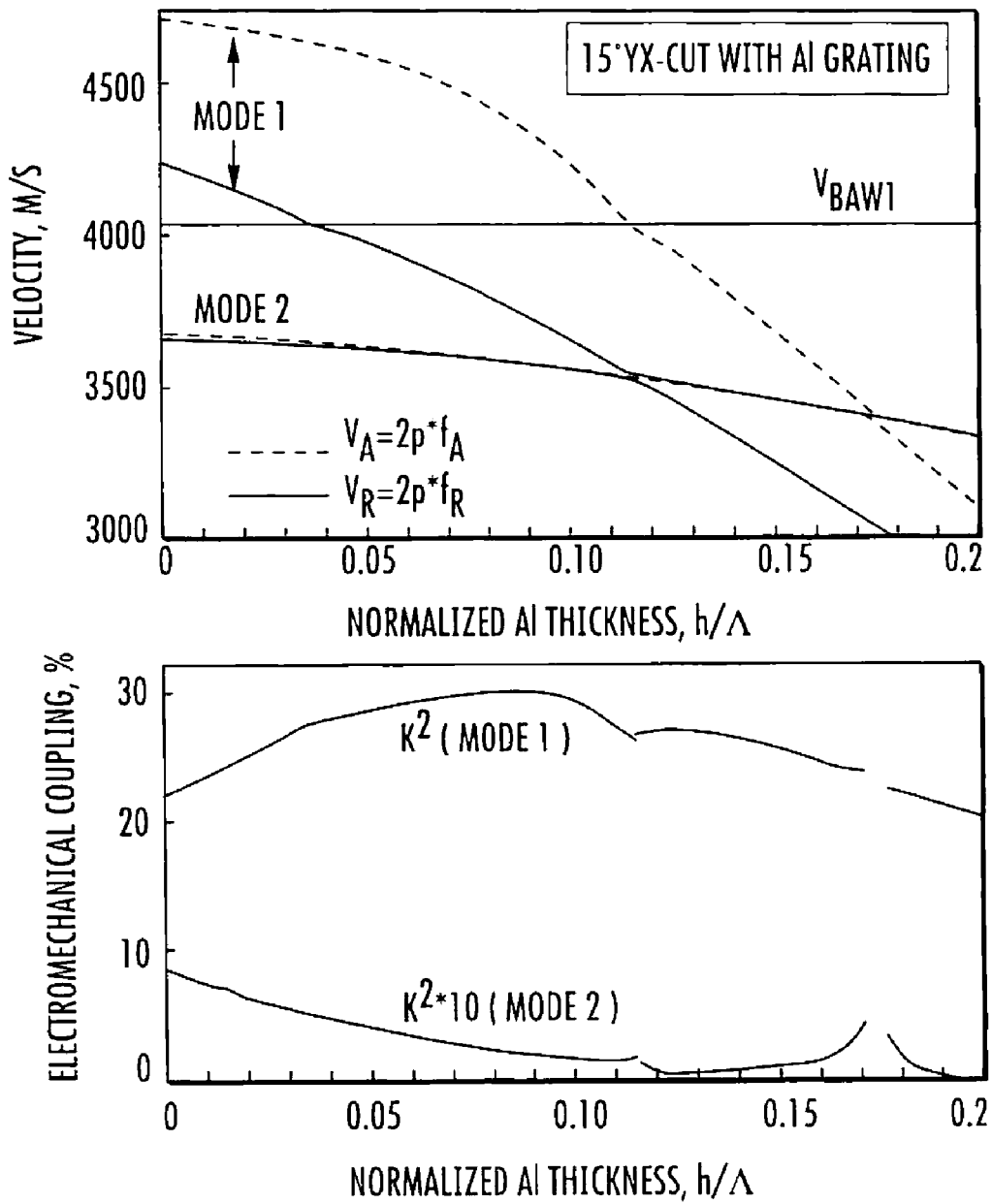
FIG. 3 graphically illustrates velocities of two modes, propagating in 15°-YX cut of $LiNbO_3$ with open-circuit and short-circuit grating, and electromechanical coupling coefficients of these modes, as functions of normalized electrode thickness h/2p: (a) Electrode material is Al; (b) Electrode material is Cu.
Figure 3B:
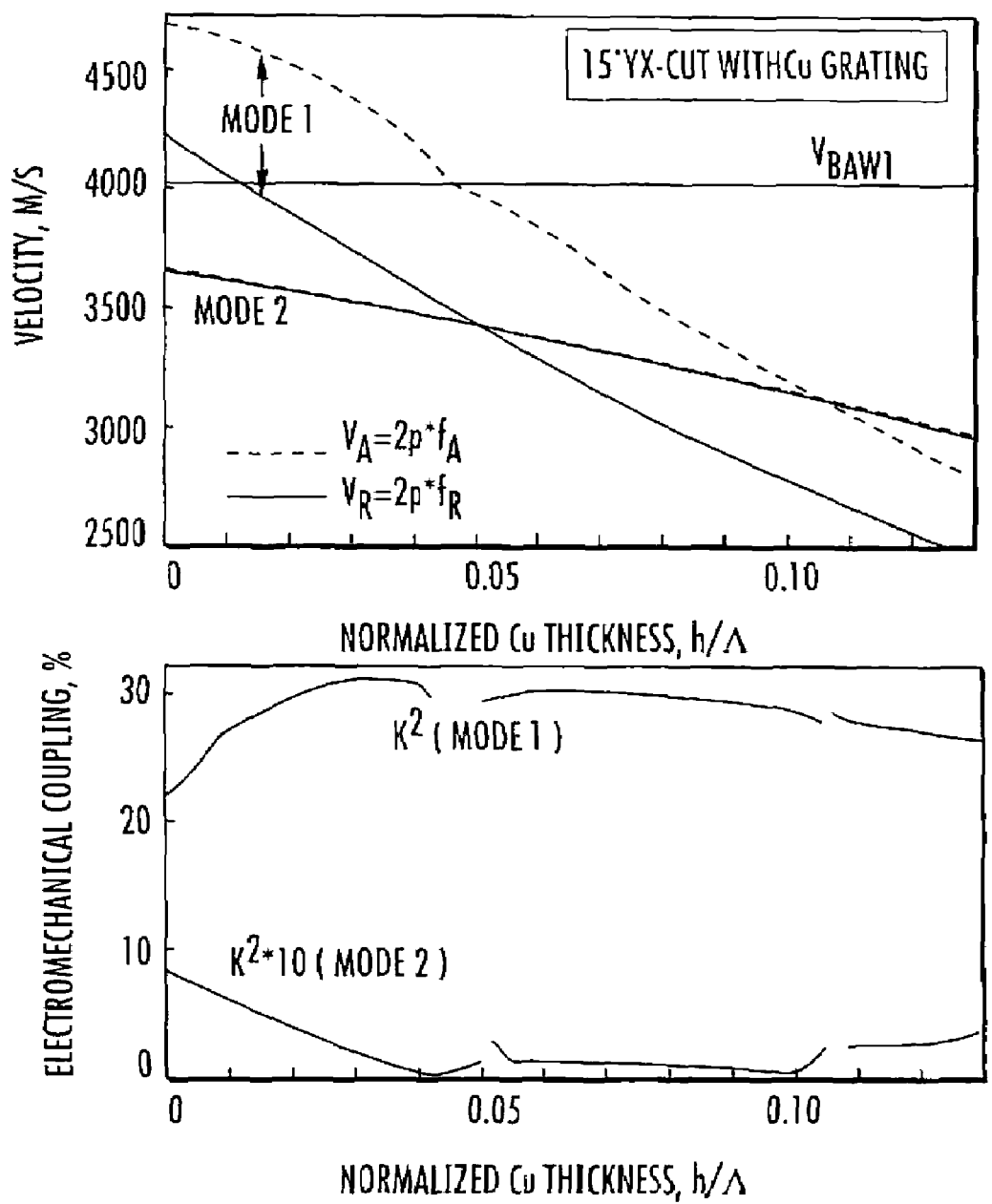
Figure 4A:
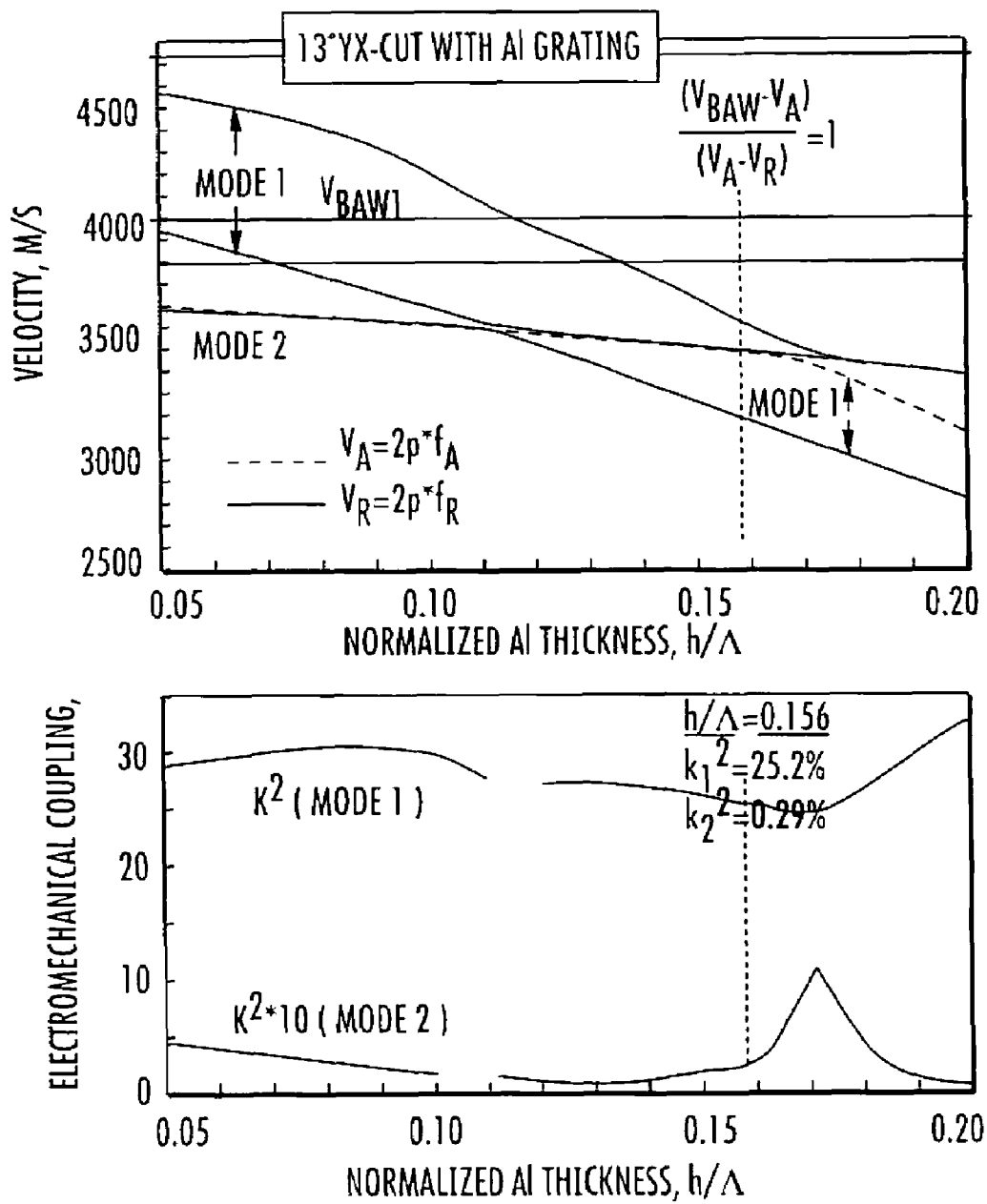
FIG. 4 graphically illustrates velocities of two modes, propagating in 13°-YX cut of $LiNbO_3$ with open-circuit and short-circuit grating, and electromechanical coupling coefficients of these modes, as functions of normalized electrode thickness h/2p: (a) Electrode material is Al; (b) Electrode material is Cu, wherein for the found optimal electrode thicknesses, electromechanical coupling coefficients of two modes are determined.
Figure 4B:
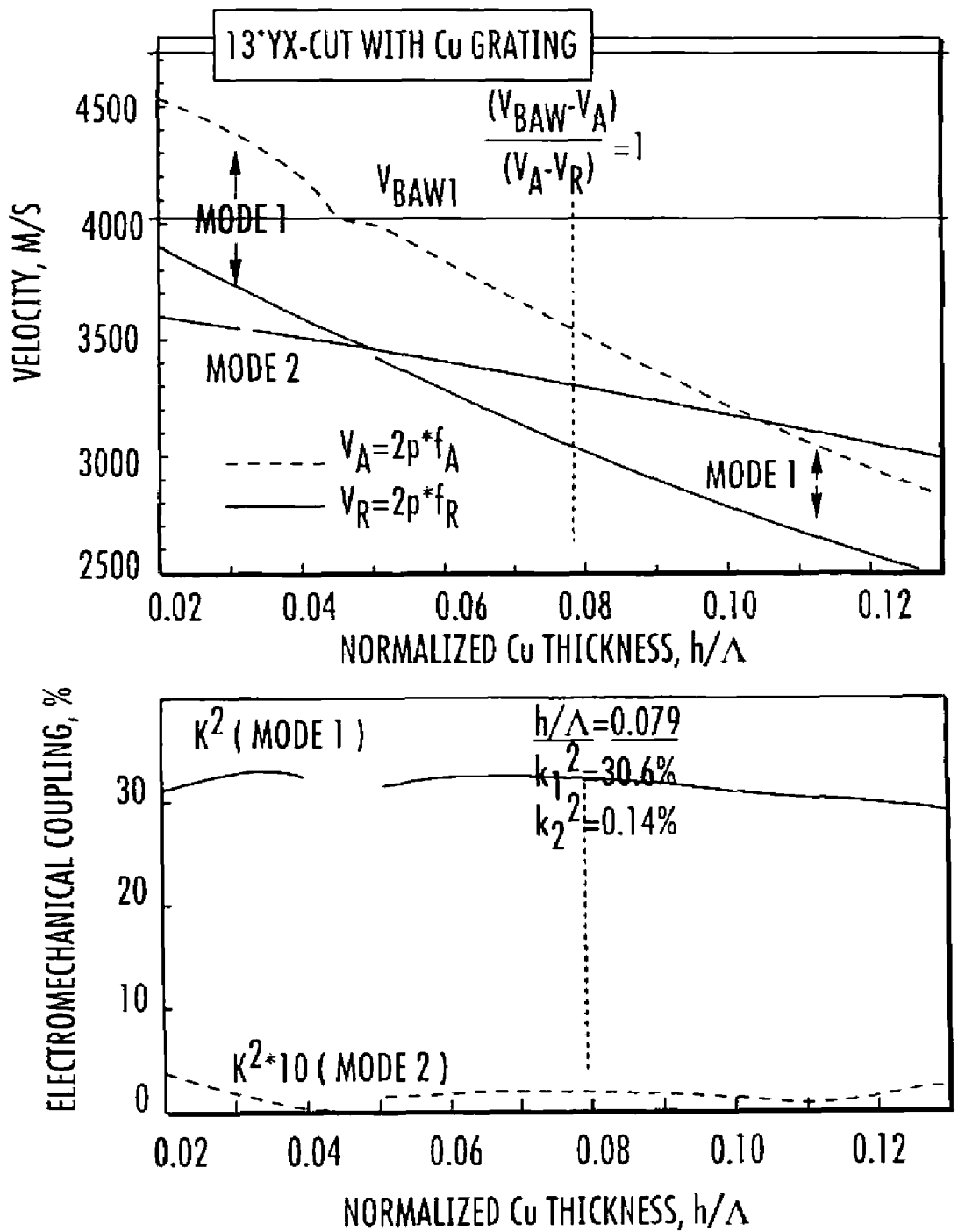

To verify if the spurious response can be suppressed by optimizing electrode thickness, the characteristics of two surface modes, which propagate in 15°-YX cut, were calculated as functions of normalized electrode thickness $h/\Lambda$, with Cu and Al electrodes. The results of calculations are shown in FIG. 3a and FIG. 3b, respectively. For each analyzed thickness, the resonant and anti-resonant frequencies, $f_R$ and $f_A$, were extracted from the calculated admittance of infinite periodic grating, and the corresponding velocities at resonance and anti-resonance were calculated, as $V_R=2_p*f_R$ and $V_A=2_p*f_A$. Without grating, two modes propagate in the analyzed orientation, LSAW with velocity $V>V_{BAW1}$ and SAW with velocity $V<V_{BAW1}$, where $V_{BAW1}=4028.96$ m/s is the calculated velocity of the slow quasi-shear BAW propagating along the surface. For each mode, the difference between resonant and anti-resonant frequencies determines its electromechanical coupling coefficient $k^2$. Without grating, in 15°-YX cut the electromechanical coupling of LSAW mode (Mode 1) and SAW mode (Mode 2) are $k_1^2=22\%$ and $k_2^2=8.5\%$, respectively. With increasing electrode thickness, LSAW velocity decreases and crosses $V_{BAW1}$. This results in transformation of Mode 1 from LSAW to non-leaky SAW propagating without attenuation. Its electromechanical coupling grows with thickness and reaches maximum value of about 30% at $h=9\%$ $\Lambda$ for Al electrodes (FIG. 3a) and at $h=3.2\%$ $\Lambda$ for Cu electrodes (FIG. 3b).

Between $h_1=12\%$ $\Lambda$ and $h_2=17.5\%$ $\Lambda$ for Al electrodes, and between $h_1=5\%$ $\Lambda$ and $h_2=11\%$ $\Lambda$ for Cu electrodes, Mode 2 occurs between resonant and anti-resonant frequencies of Mode 1, as a parasitic mode. Minimum coupling of this parasitic mode is expected at the optimal thicknesses $h=12\%$ $\Lambda$ for Al grating (FIG. 3a) and $h=9.5\%$ $\Lambda$ for Cu grating (FIG. 3b). In both cases, the coupling of parasitic mode grows dramatically with small variation of electrode thickness around these optimal values, because of strong interaction between two modes. Therefore, in the analyzed orientation, it is difficult to improve the resonator performance by optimization of electrode thickness. However, the performance of a resonator filter can be improved if the cut angle and electrode thickness are simultaneously optimized.

For the purposes of this detailed description of preferred embodiments of the present invention, the rotational orientation of wafers cut for crystals are described using Euler angles. According to Euler's description, any rotations are defined by three parameters. Although there are several different notational conventions, in this work x-convention is used. In the x-convention, the rotation given by Euler angles ($\lambda$, $\mu$, and $\theta$), where the first rotation is by an angle $\lambda$ about the z-axis, the second is by an angle $\mu$ about the x-axis, and the third is by an angle $\theta$ about the z-axis again. The surface of the wafer is defined by the x-y plane corresponding to the third rotation with the direction of propagation in the direction specified by the third angle, $\theta$. The convention used for this work is consistent with the Euler angle convention described by Slobodnik et al. in "Microwave Acoustic Handbook," Vol. 1, *Surface Wave Velocities*, AFCRL-70-0164, March 1970, Physical Sciences Research Papers, No. 414, Office of Aerospace Research, USAF. Similar descriptions may be found in the prior art, U.S. Pat. No. 6,833,774 B2 for example. The description of the present invention also refers to rotational orientation of the wafers cut from the crystals as Y-rotated and X-propagating. This description involves only a single rotation, $\omega$. The equivalent Euler angles are ($\lambda=0$, $\mu=90-\psi$, $\theta=0$).

For the purposes of this detailed description of preferred embodiments of the present invention, a SAW filter is intended to refer to resonant type SAW devices comprised of one or more interdigitated transducers and/or gratings. These devices might be composed of impedance element type resonators, or longitudinally coupled type element resonators, or a combination of the two.

To optimize simultaneously orientation and electrode thickness in rotated YX-cuts of $LiNbO_3$, the characteristics of two modes, which propagate in these cuts, were calculated in the narrow interval of rotation angles, from 13° to 21°. These orientations are characterized by the Euler angles (0, μ, 0), where μ changes between −69° and −77°. Two electrode materials were investigated, Al and Cu. For each electrode material, the propagation velocities $V_R$ and $V_A$, estimated at resonant and anti-resonant frequencies, and electromechanical coupling coefficients of two modes were calculated as functions of normalized electrode thickness h/2p, for each analyzed orientation. The results of calculations are shown for 13°YX, 15°YX, 17°YX, 19°YX and 21°YX with Al grating in FIG. 4a, FIG. 5a, FIG. 6a, FIG. 7a and FIG. 8a, respectively. Characteristics of two modes in the same orientations with Cu grating FIG. 4b, FIG. 5b, FIG. 6b, FIG. 7b and FIG. 8b.

For each orientation, the optimal electrode thickness was determined using the following criteria:

1) $(V_{BAW1}-V_A) \geqq (V_A-V_R)$;

2) Minimum $k^2$ for Mode 2 (generally smaller than 0.075%).

3) High $k^2$ for Mode 1 (generally larger than 17%).

The first criterion follows from the requirement of the absence of BAW radiation inside the passband of typical ladder filter, which consists of series and parallel (shunt) resonators, such that the anti-resonant frequency of the shunt elements coincides with the resonant frequency of the series elements. Then the upper passband edge of the filter is determined by the anti-resonant frequency of the series element, $f_{up}=f_R+2*(f_A-f_R)$. BAW radiation does not occur inside the filter passband if $f_{up} \leqq f_{BAW1}$. It is equivalent to the relation $(f_{BAW1}-f_R) \geqq (f_A-f_R)$ or $(V_{BAW1}-V_A) \geqq (V_A-V_R)$.

The second requirement provides lower ripples of frequency response, which are caused by parasitic SAW mode (Mode 2), compared to prior art substrate orientation, 15°YX-cut of $LiNbO_3$.

The third requirement provides improved performance of wideband filter, compared to the prior art substrate orientations, due to high electromechanical coupling (higher than in 41°YX-cut of $LiNbO_3$) combined with zero attenuation of non-leaky wave.

If the first requirement is satisfied, the coupling of Mode 2 is then minimized. For example, in 13°-YX cut with Al grating (FIG. 4a) the first requirement is satisfied if $h_{Al} \geqq 15.6\%$ Λ. At these thicknesses, the coupling of Mode 2 is minimum, $k_2^2=0.29\%$, if $h_{Al}=15.6\%$ Λ. Though lower coupling of parasitic mode can be obtained at $h_{Al}=13\%$ Λ, this thickness does not satisfy the first criterion of BAW radiation outside the filter passband. At the specified optimal thickness, $h_{Al}=15.6\%$ Λ, the coupling of Mode 1 is sufficiently high, $k_1^2=25.2\%$.

In the same orientation with Cu grating, the optimal electrode thickness was found to be h=7.9% Λ, with $k_1^2=30.6\%$ and $k_2^2=0.14\%$.

In analogous way, the optimal thickness of Al and Cu gratings was determined for other analyzed orientations as follows.

Figure 5A:
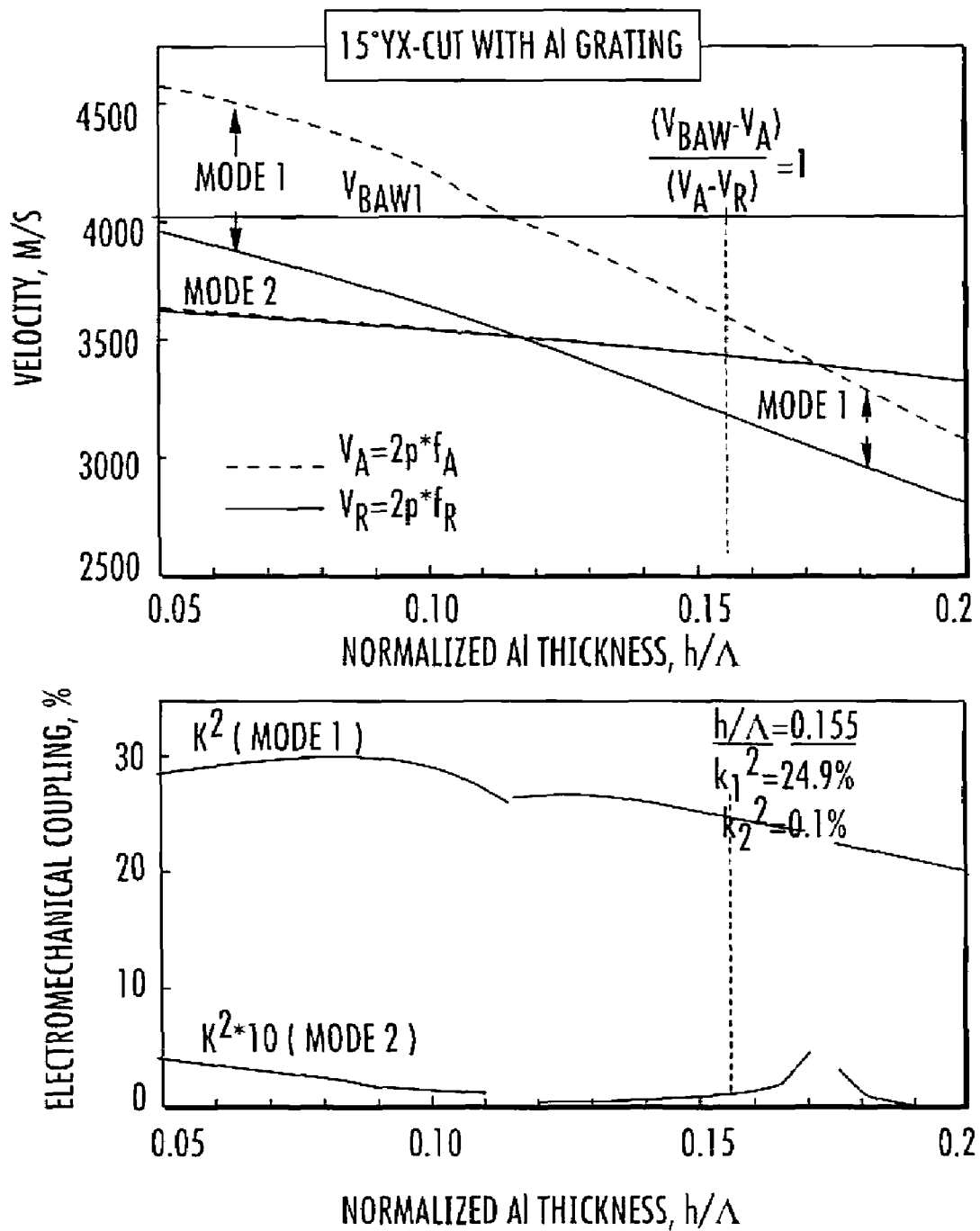
FIG. 5 graphically illustrates velocities of two modes, propagating in 15°-YX cut of $LiNbO_3$ with open-circuit and short-circuit grating, and electromechanical coupling coefficients of these modes, as functions of normalized electrode thickness h/2p: (a) Electrode material is Al; (b) Electrode material is Cu, wherein for the found optimal electrode thicknesses, electromechanical coupling coefficients of two modes are determined.
Figure 5B:
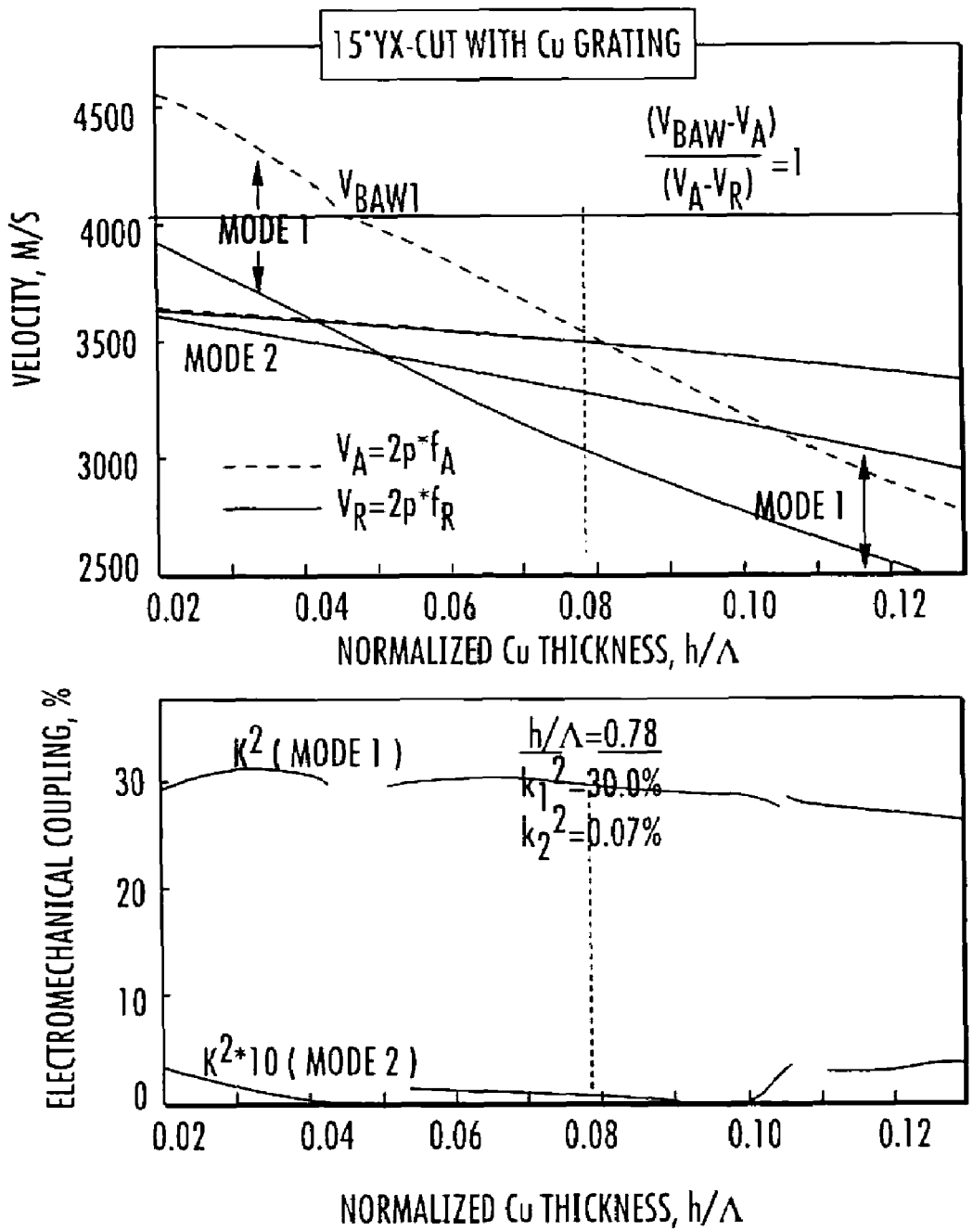

In 15°-YX cut, the optimal thickness is h=15.5% Λ for Al electrodes, with $k_1^2=24.9\%$ and $k_2^2=0.1\%$ (FIG. 5a) and h=7.8% Λ for Cu electrodes, with $k_1^2=30.0\%$ and $k_2^2=0.07\%$ (FIG. 5b).

Figure 6B:
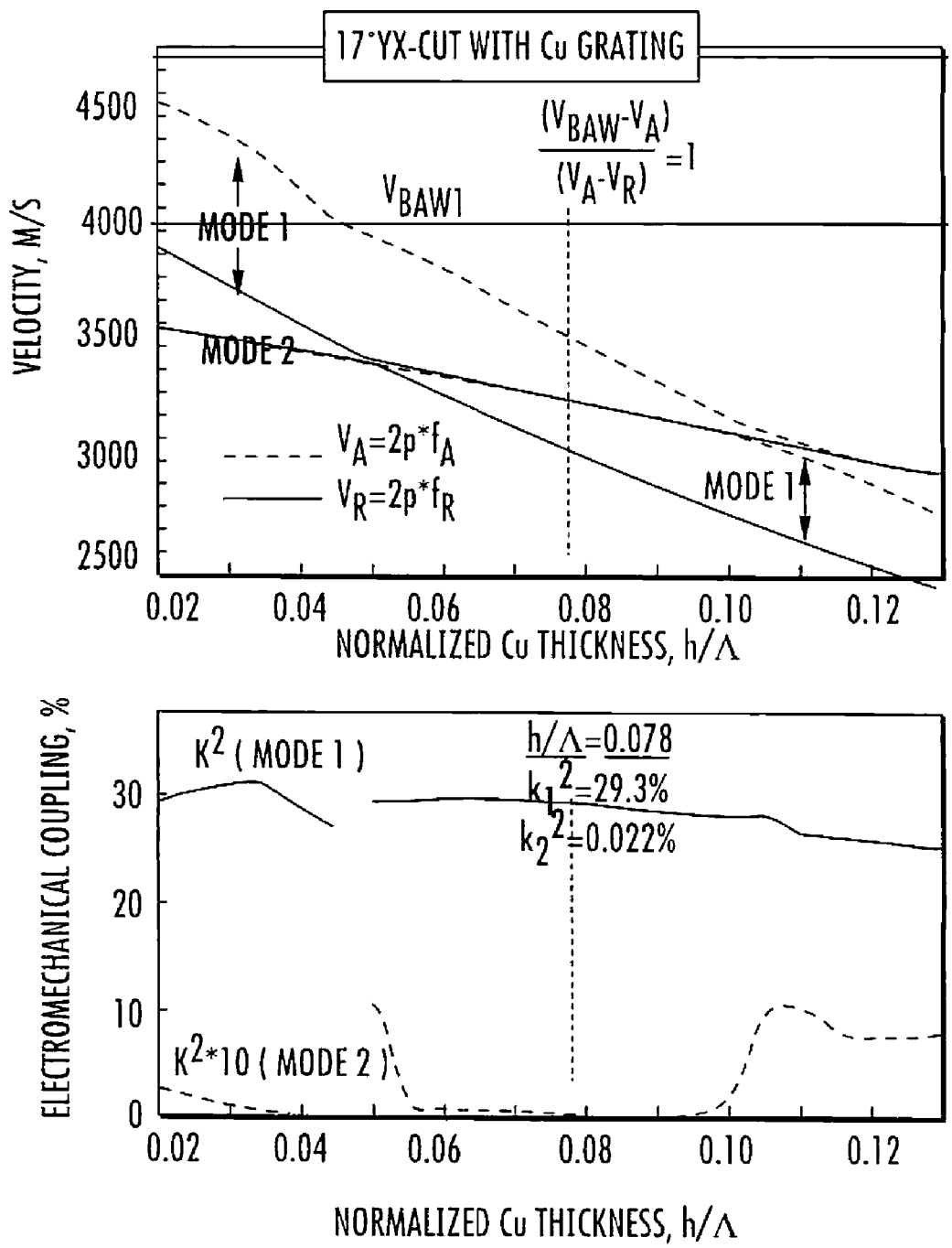

In 17°-YX cut, the optimal thickness is h=15.4% Λ for Al electrodes, with $k_1^2=24.2\%$ and $k_2^2=0.021\%$ (FIG. 6a) and h=7.8% Λ for Cu electrodes, with $k_1^2=29.3\%$ and $k_2^2=0.022\%$ (FIG. 6b).

Figure 7A:
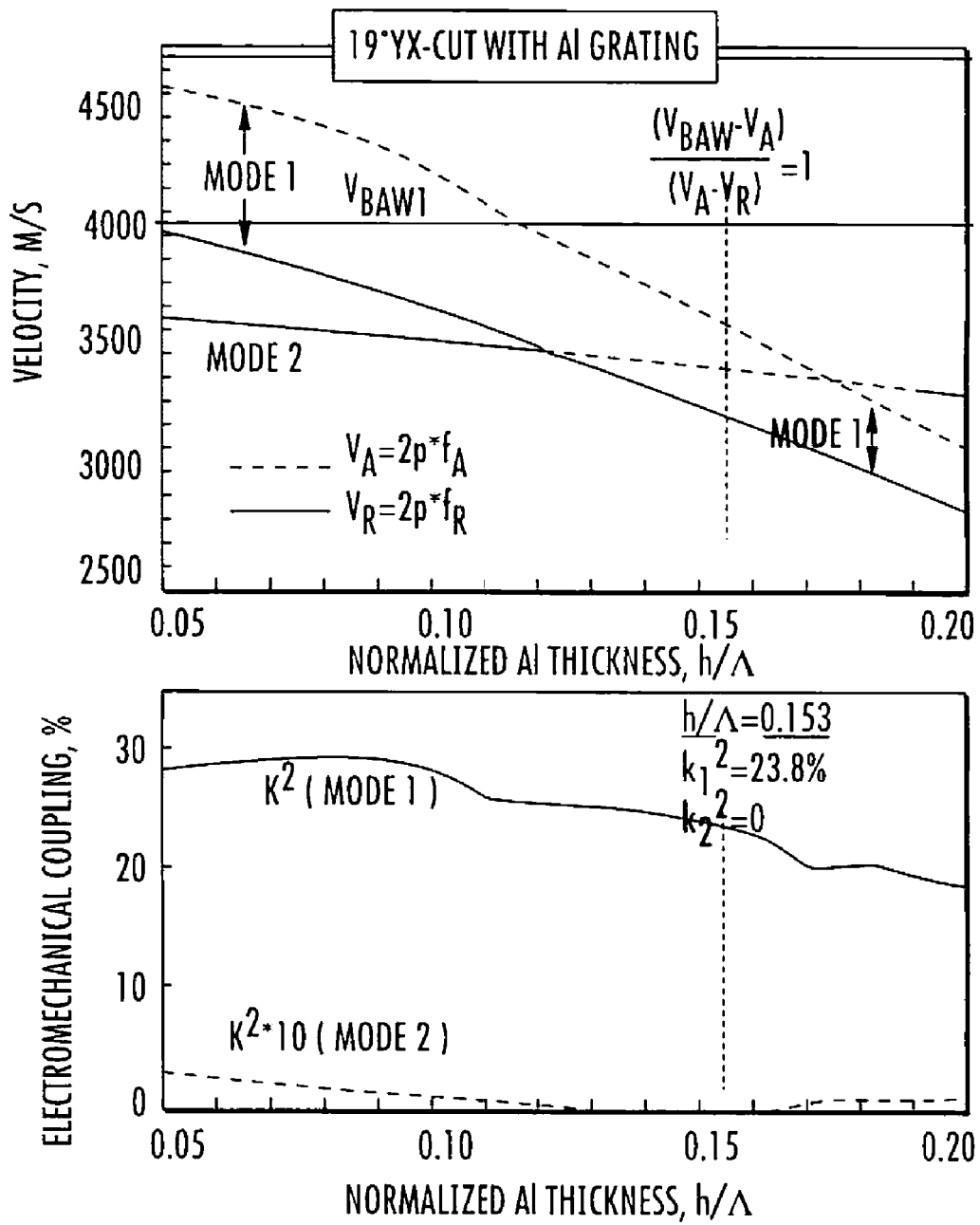
FIG. 7 graphically illustrates velocities of two modes, propagating in 19°-YX cut of $LiNbO_3$ with open-circuit and short-circuit grating, and electromechanical coupling coefficients of these modes, as functions of normalized electrode thickness h/2p: (a) Electrode material is Al; (b) Electrode material is Cu, wherein for the found optimal electrode thicknesses, electromechanical coupling coefficients of two modes are determined.
Figure 7B:
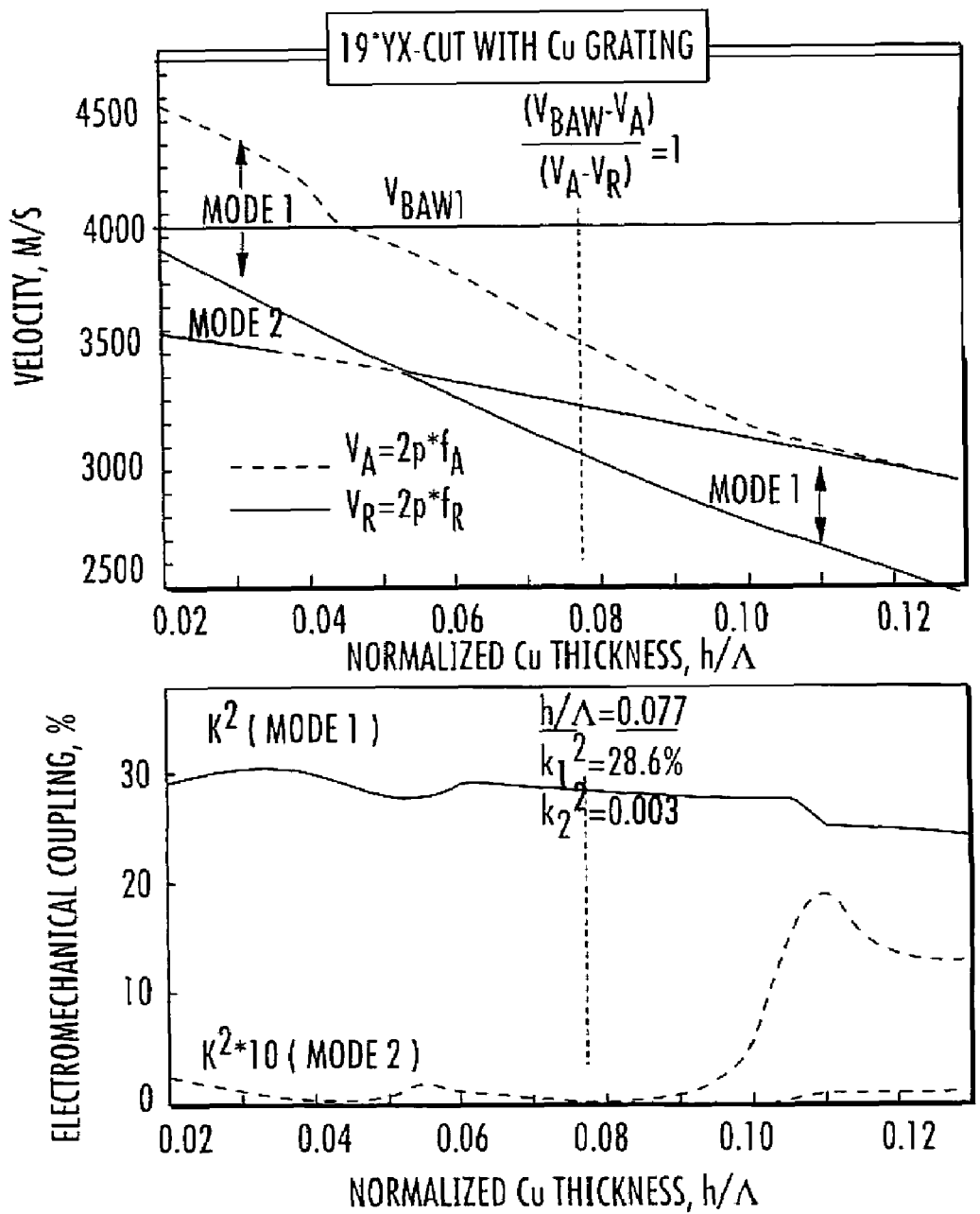

In 19°-YX cut, the optimal thickness is h=15.3% Λ for Al electrodes, with $k_1^2=23.8\%$ and $k_2^2<0.0001\%$ (FIG. 7a) and h=7.7% Λ for Cu electrodes, with $k_12=28.6\%$ and $k_2^2<0.0001\%$ (FIG. 7b).

Figure 8A:
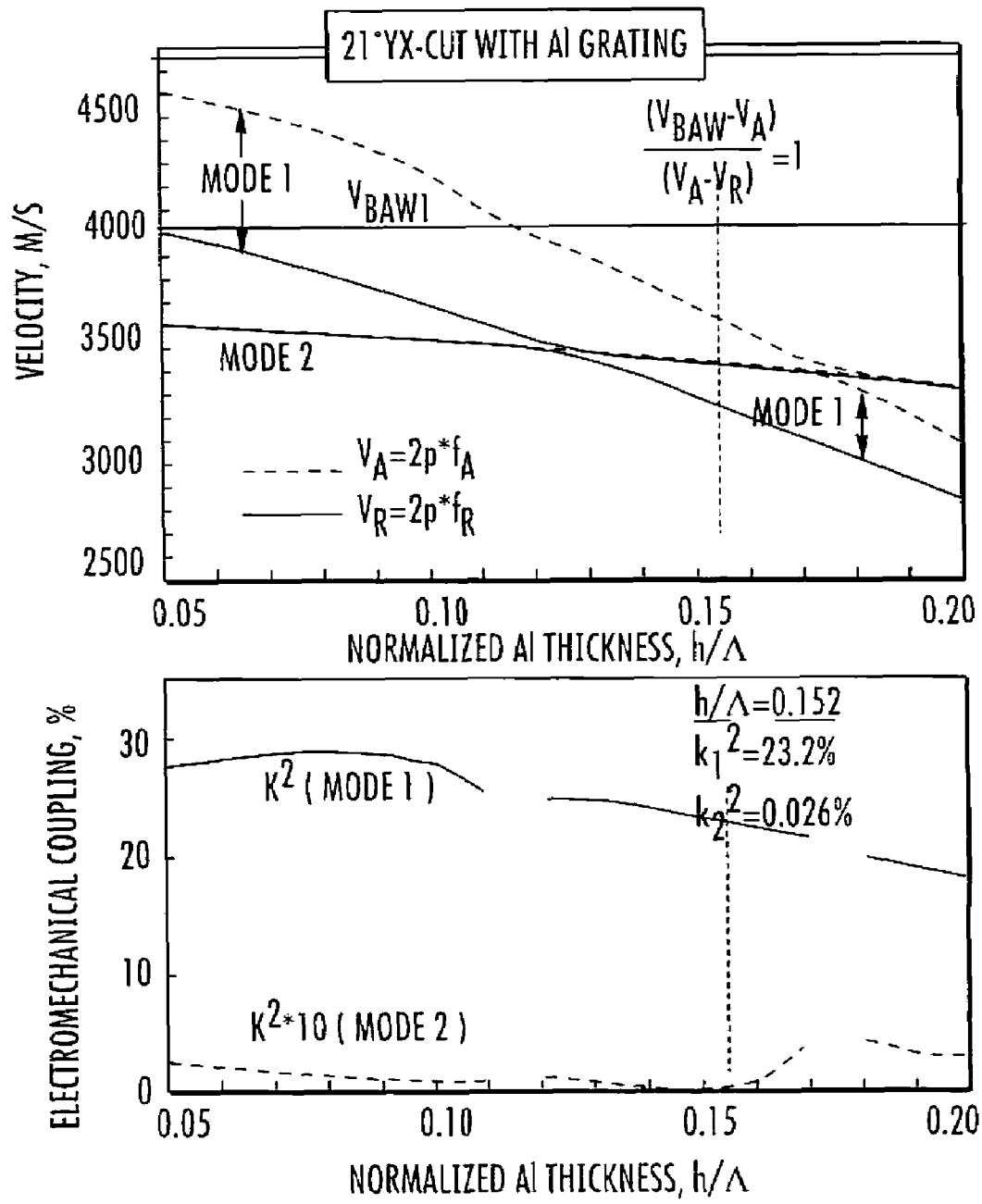
FIG. 8 graphically illustrates velocities of two modes, propagating in 21°-YX cut of $LiNbO_3$ with open-circuit and short-circuit grating, and electromechanical coupling coefficients of these modes, as functions of normalized electrode thickness h/2p: (a) Electrode material is Al; (b) Electrode material is Cu, wherein for the found optimal electrode thicknesses, electromechanical coupling coefficients of two modes are determined.
Figure 8B:
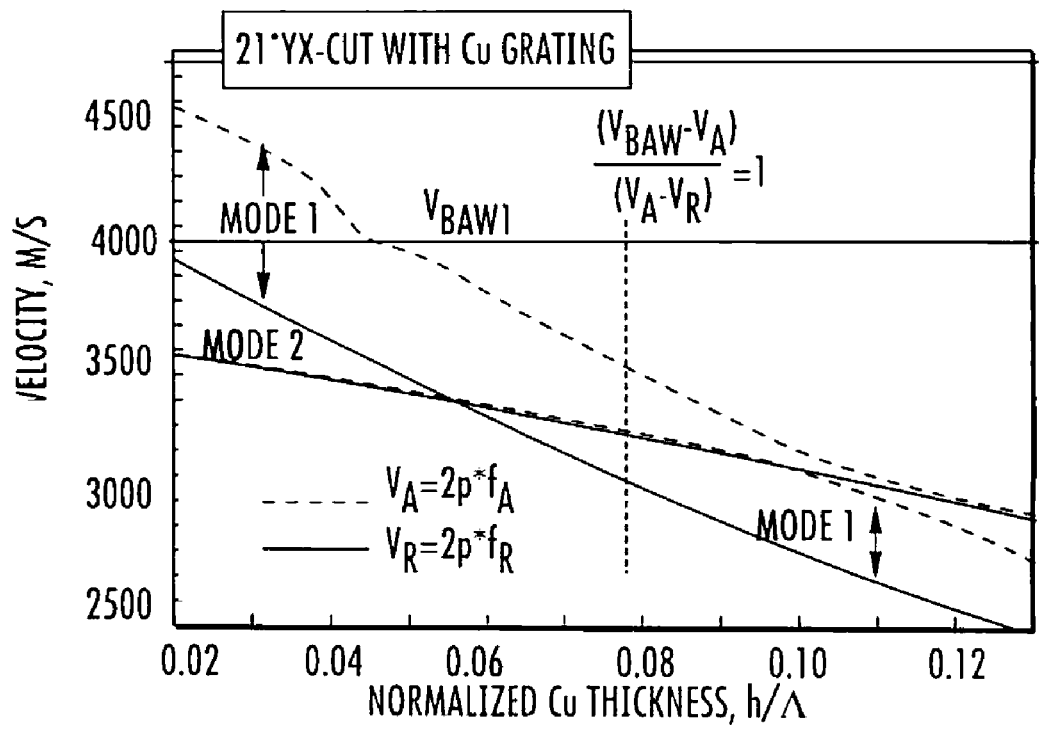
Figure 8B:
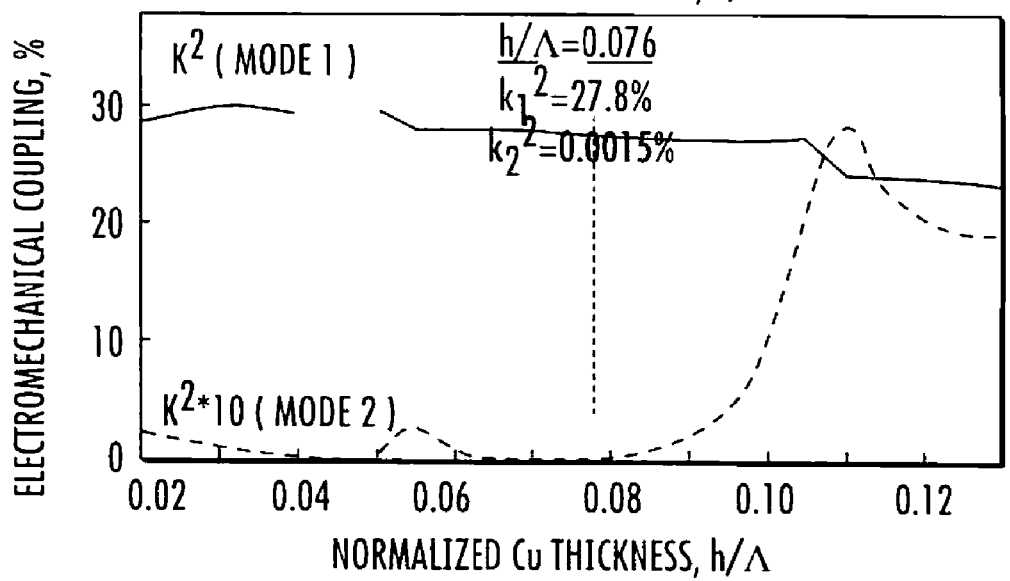

In 21°-YX cut, the optimal thickness is h=15.2% Λ for Al electrodes, with $k_1^2=23.2\%$ and $k_2^2=0.026\%$ (FIG. 8a) and h=7.6% Λ for Cu electrodes, with $k_1^2=27.8\%$ and $k_2^2=0.0015\%$ (FIG. 8b).

Figure 9:
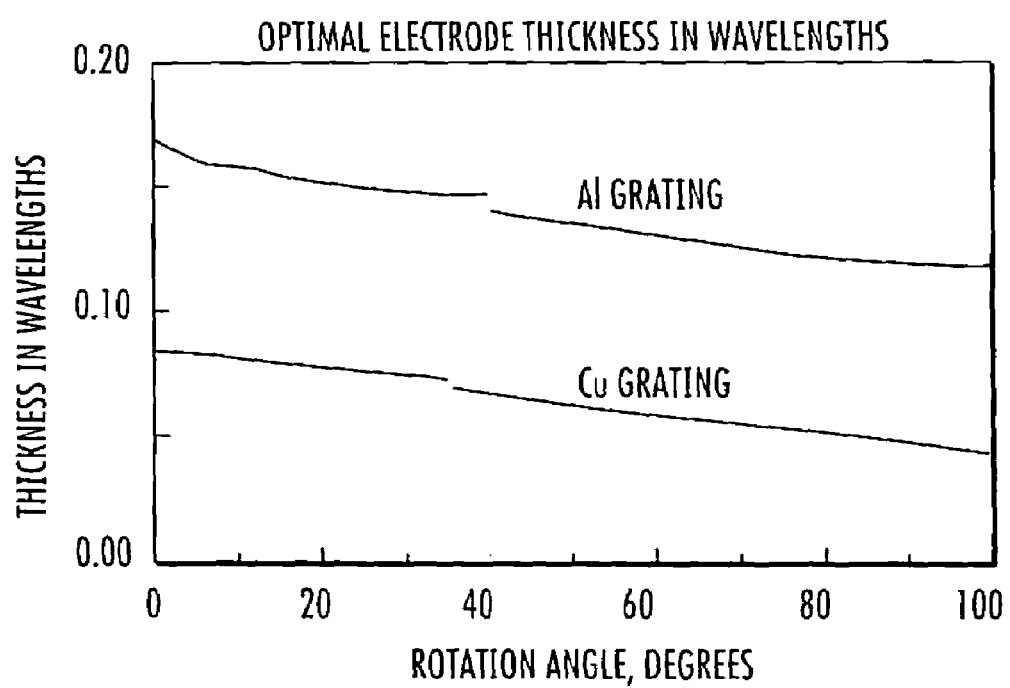
FIG. 9 graphically illustrates optimal electrode thickness in wavelengths $\Lambda=2p$, as functions of rotation angle, in rotated YX-cuts of $LiNbO_3$ with Al and Cu gratings.
Figure 10:
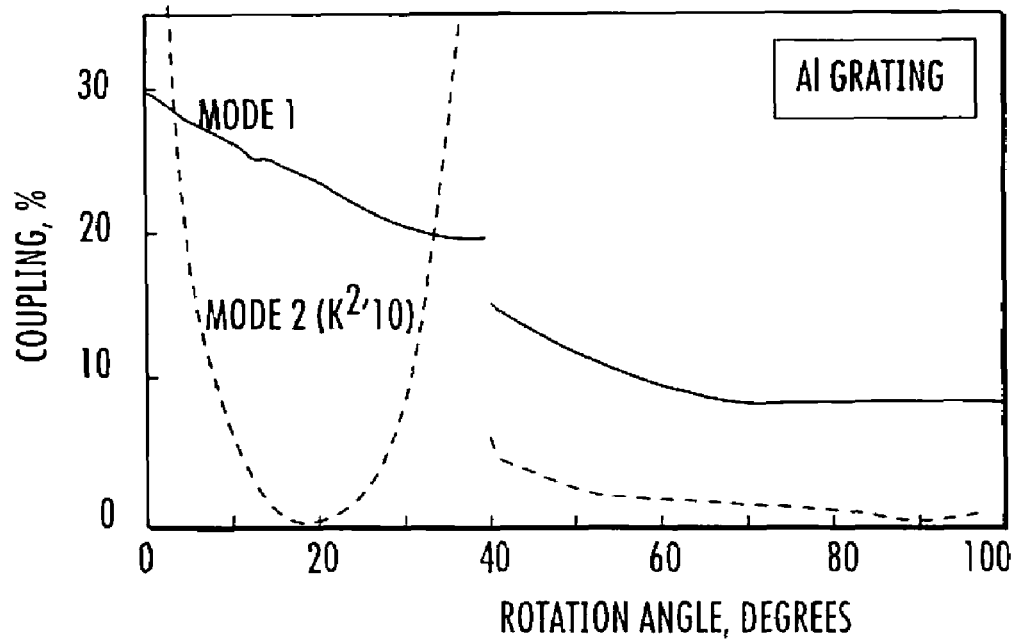
FIG. 10 graphically illustrates electromechanical coupling coefficients of two modes propagating in rotated YX-cuts of $LiNbO_3$ with Al (a) and Cu (b) gratings of optimal thickness, as functions of rotation angle, wherein the optimal thickness is determined according to dependencies shown in FIG. 9.
Figure 10:
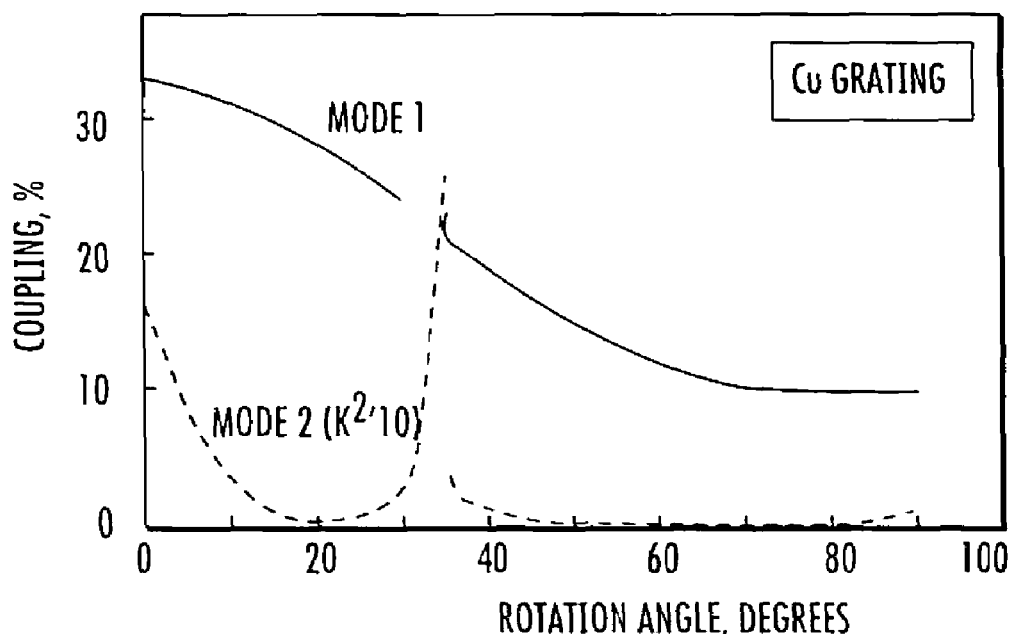

These results were summarized and complemented by the data obtained in wider interval of rotation angles. The dependencies of the optimal electrode thickness $h_{OPT}$ versus rotation angle are shown in FIG. 9. Electromechanical coupling coefficients of two modes estimated at the optimal thickness, are shown as functions of rotation angle in FIG. 10a (Al grating) and FIG. 10b (Cu grating). The discontinuities in the obtained dependences at the angle of rotation μ=40° (FIG. 10a) or μ=35' (FIG. 10b) indicate the change in the behavior of two modes. At smaller angles, parasitic resonance, caused by Mode 2, occurs between $f_R$ and $f_A$, while at larger angles the parasitic mode occurs at $f>f_A$.

Figure 11:
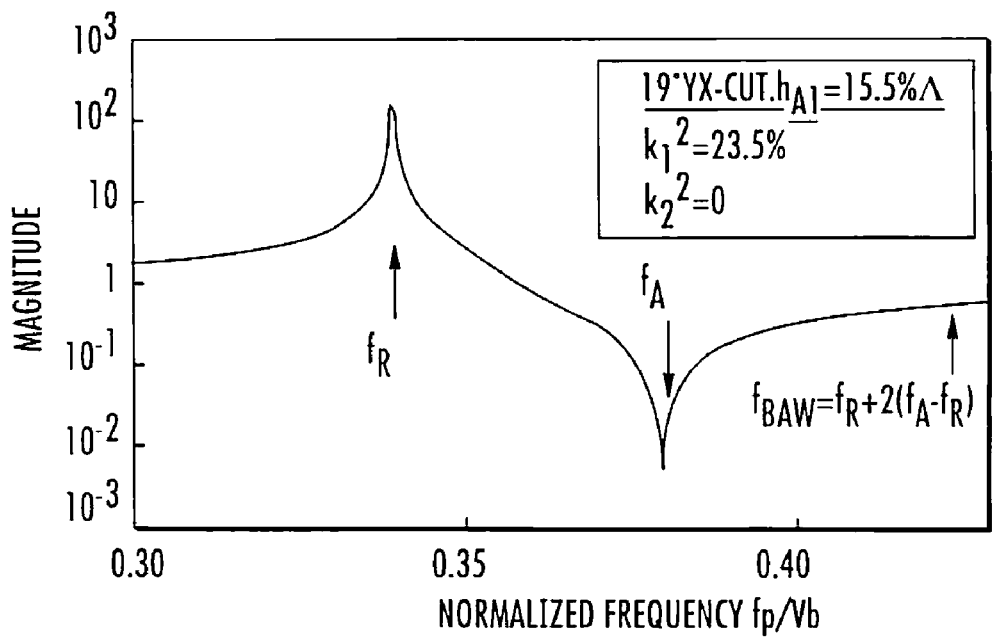
FIG. 11 graphically illustrates amplitudes of strip admittance of infinite grating of optimal thickness, deposited on the optimal orientation, which provides zero coupling of parasitic mode: a) Al grating of normalized thickness h=15.5% $\Lambda$ on 19°-YX cut; (b) Cu grating of normalized thickness h=7.6% $\Lambda$ on 20°-YX cut.
Figure 11:
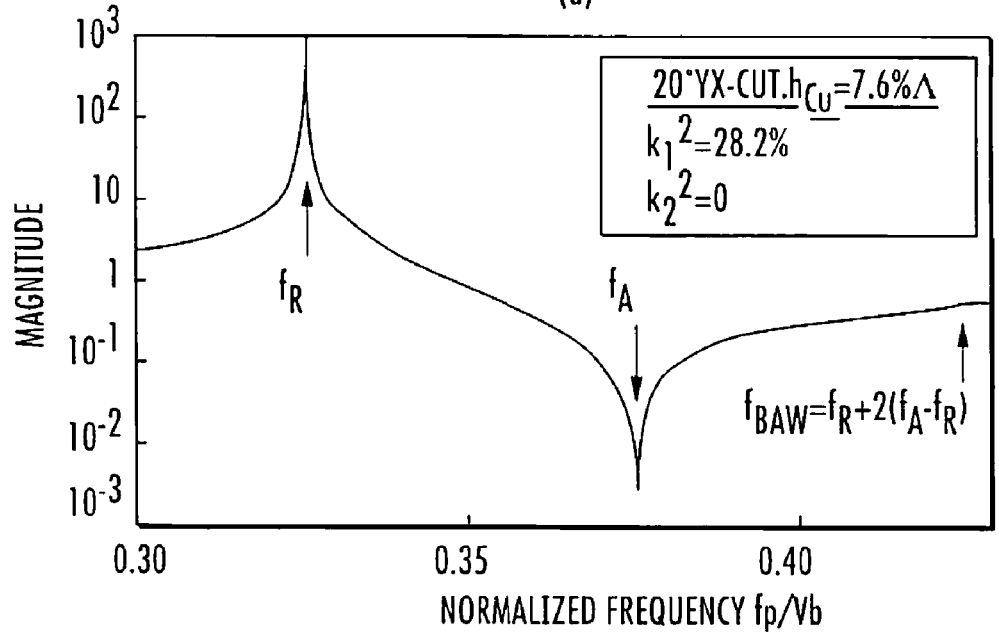

The coupling of Mode 2 is minimum in 19°-YX cut if Al is used as electrode material and in 20°-YX cut if Cu is used as electrode material. This is confirmed by the admittances shown in FIG. 11a and FIG. 11b, respectively. With optimal values of electrode thickness, in both orientations there is no parasitic resonance, and the bulk wave radiation is expected outside the filter passband.

The coupling of Mode 2 is less than 0.075% in the interval of rotation angles from 15° to 23° if Al is used as electrode material and from 15° to 25° if Cu is used as electrode material.

Figure 12:
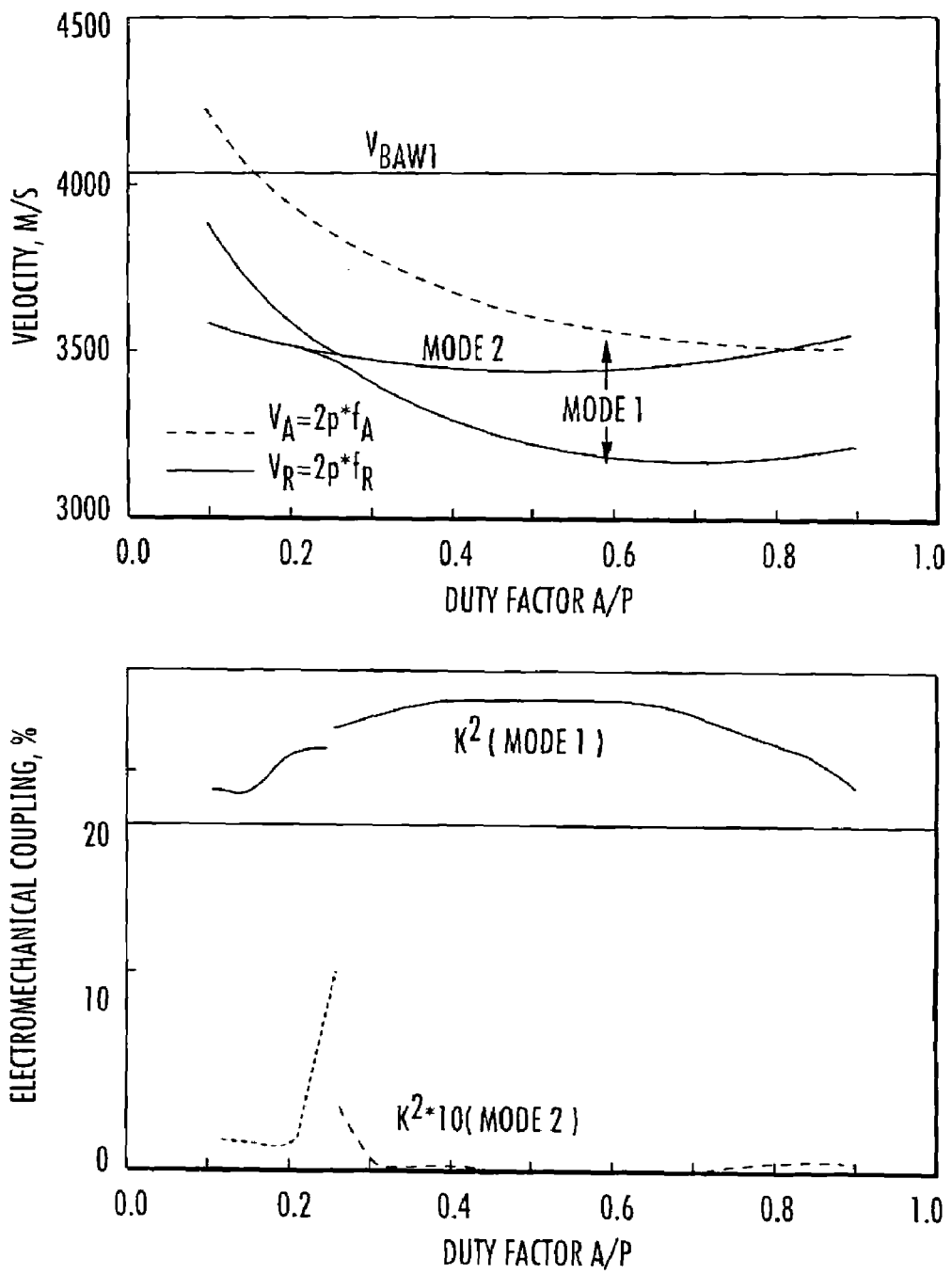
FIG. 12 graphically illustrates velocities in open-circuited and short-circuited Al gratings and electromechanical coupling coefficients of two modes, propagating in 19°-YX cut with electrode thickness h=15.5% $\Lambda$, as functions of duty factor a/p.

FIG. 12 illustrates the effect of duty factor (metallization ratio) a/p on the velocities and coupling coefficients of two modes propagating in 19°-YX cut with Al grating and optimal electrode thickness h=15.5% Λ. The coupling of parasitic mode is lower than 0.03% in a wide interval from a/p=0.3 to a/p=0.8, while the coupling of Mode 1 is higher than 21% for any a/p inside this interval. Similar dependences were obtained for 20°-YX cut with Cu grating and optimal electrode thickness h=7.6% Λ.

Figure 13:
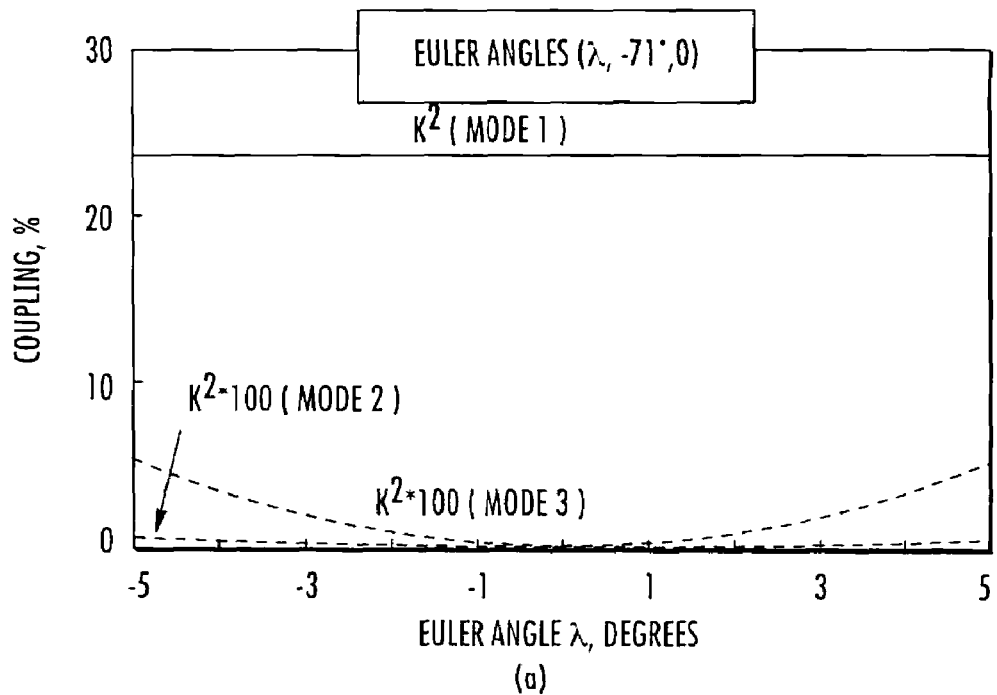
FIG. 13 graphically illustrates electromechanical coupling coefficients of three modes, propagating in non-symmetric cuts around 19°-YX cut, with Al grating of optimal thickness, h=15.5% $\Lambda$, and duty factor a/p=0.5, (a) as functions of Euler angle $\lambda$, in orientations with Euler angles ($\lambda$, −71°, 0), (b) as functions of Euler angle $\theta$, in orientations with Euler angles (0, −71°, $\theta$)
Figure 13:
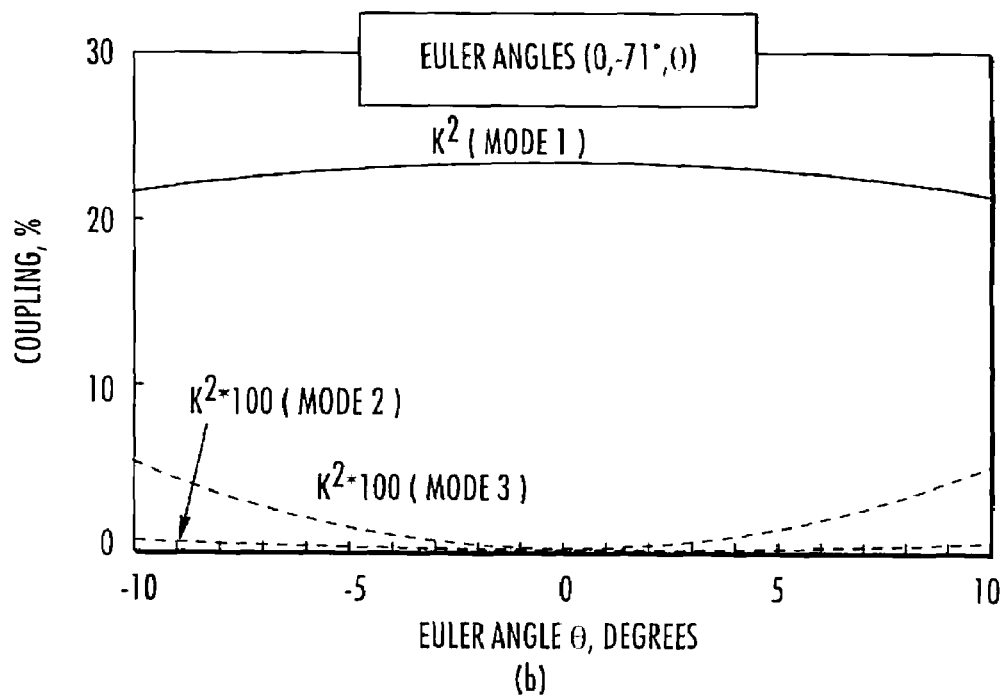

The effect of deviation of crystal orientation from symmetric cut on the electromechanical coupling of two modes is shown in FIG. 13. As an example, 19°-YX cut with Al grating of optimal thickness, h=15.5% Λ, was analyzed. With variation of the first Euler angle λ in the interval from −5° to +5° (FIG. 13a) and with variation of the third Euler angle θ in the interval from −10° to +10° (FIG. 13b), the coupling of Mode 2 stays small (less than 0,004%) and the coupling of Mode 1 reduces by less than 10% of its value in symmetric orientation. However, the application of orientations with absolute value of Euler angle θ larger than 5° is limited by increasing power flow angle of Mode 1. Therefore, maximum acceptable deviation from symmetric orientation is ±5° for both angles, λ and θ.

In some applications, the second requirement may be insufficient to suppress the parasitic mode to an acceptable level. For these applications, an acoustic absorbing material may be placed near the acoustically active area. The absorbing material is selected to preferentially absorb the parasitic mode and allow the desired mode to propagate with as little attenuation as possible. The parasitic mode has a polarization that is consistent with a Rayleigh wave, while the desired mode has a polarization that is dominated by its horizontal shear component. Therefore, various organic compounds, such as polymers, photoresist, and epoxies would all be well suited for this application. Several of these, type of, compounds have been commonly applied to absorbing surface waves. However, their purpose has previously been limited to regions where it was desired to suppress all acoustic activity. This situation is different. For this embodiment it is desired to suppress one type of acoustic mode while simultaneously allowing another to propagate unimpeded.

Figure 14:
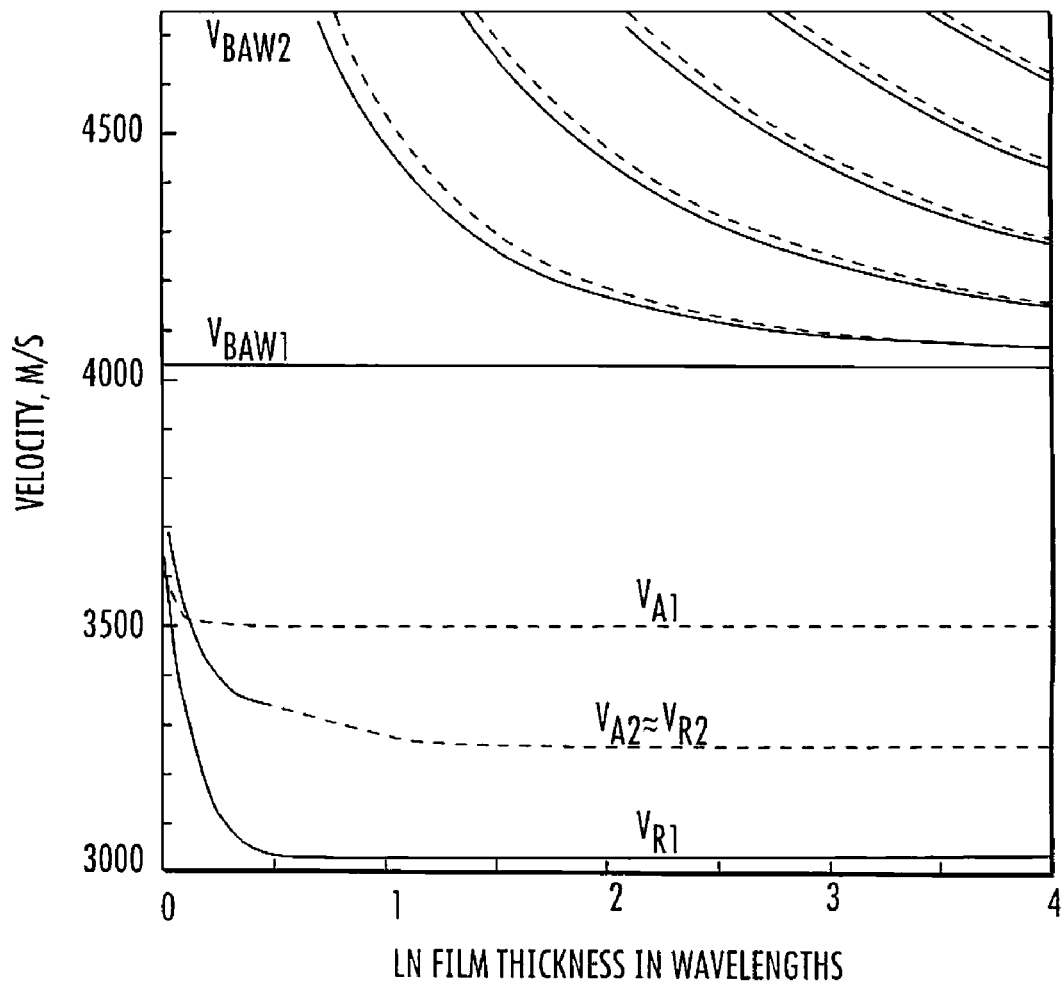
FIG. 14 graphically illustrates velocities of fundamental and higher-order modes, propagating in thin film of 19° YX-cut of $LiNbO_3$ bonded to silicon substrate, with open-circuited (dashed lines) and short-circuited (solid lines) Cu grating, as functions of $LiNbO_3$ film thickness, $h_{Cu}$=8% $\Lambda$, a/p=0.5.

The temperature compensation of a resonator filter, which utilizes non-leaky SAW in rotated Y-cuts of $LiNbO_3$, can be improved by bonding of $LiNbO_3$ wafer of optimal orientation, with optimal thickness of Al or Cu grating, to silicon, glass, Pyrex or another material, to obtain composite wafer with improved temperature stability. As an example, FIG. 14 illustrates propagation velocities of the fundamental and higher-order modes, which propagate in bonded structure 19°-YX $LiNbO_3$ on silicon, with Cu grating of thickness h=8% $\Lambda$. The propagation velocities of all modes, estimated at resonant and anti-resonant frequencies, are shown as functions of $LiNbO_3$ film thickness. The higher-order modes can propagate in the analyzed bonded wafer with velocities $V > V_{BAW1}$, and therefore no spurious modes are expected to deteriorate filter response inside the pass band.

Thus, according to the foregoing results, the optimal area of orientations for resonator type filters, utilizing non-leaky waves in $LiNbO_3$ single crystals, is defined by the Euler angles $(\lambda, \mu, \theta)$, where the angle $\lambda$ was found to be greater than $-5°$ and smaller than $5°$, the angle $\mu$ was found to be greater than $-75°$ and smaller than $-65°$, and the angle $\theta$ was found to be greater than $-5°$ and smaller than $5°$, while the optimal normalized thickness of electrode grating, with Al as primary component of electrode material, changes within the range from 12% $\Lambda$ to 17.5% $\Lambda$, and metallization ratio of the resonators changes from 0.3 to 0.8. A preferred embodiment of the present invention has orientation Euler angles $(0°, -71°, 0°)$, with nominal Al electrode thickness 15.5% $\Lambda$ and nominal metallization ratio a/p=0.5.

Figure 15:
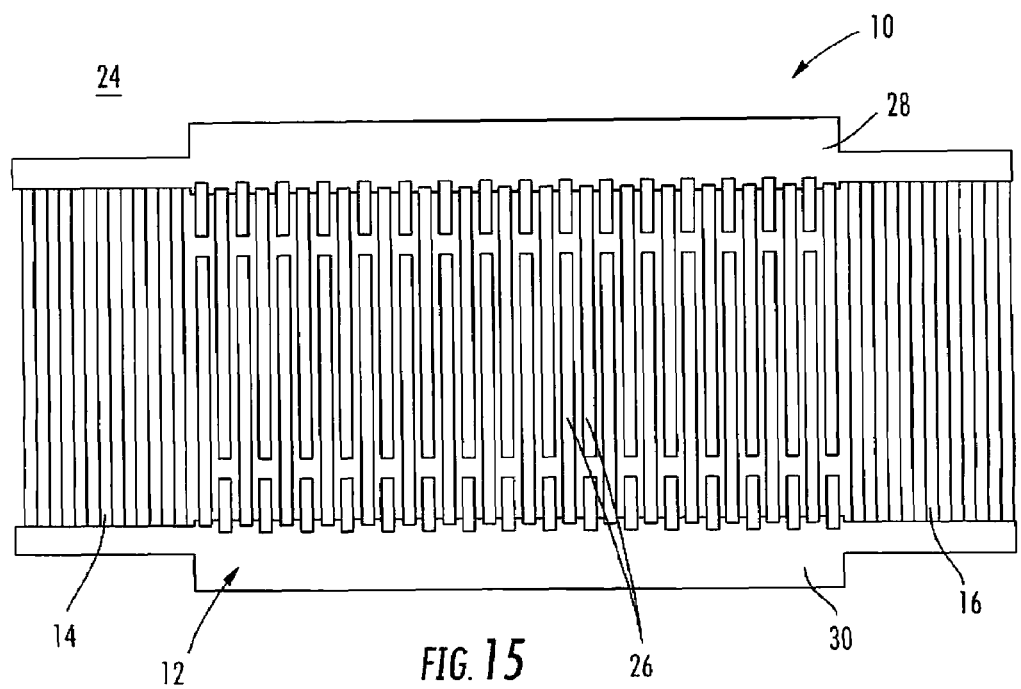
FIG. 15 illustrates one SAW resonator including a transducer embedded between two reflectors forming an impedance element useful in a ladder filter.
Figure 19:
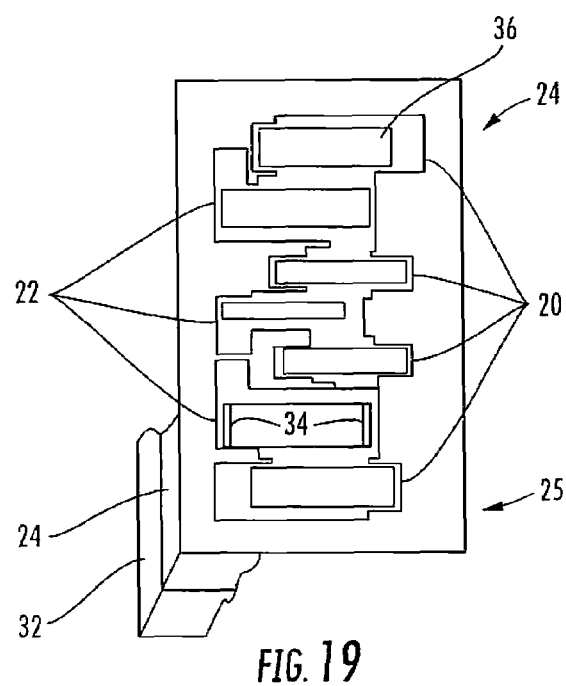
FIG. 19 is a diagrammatical illustration of one ladder filter embodiment.
Figure 18A:
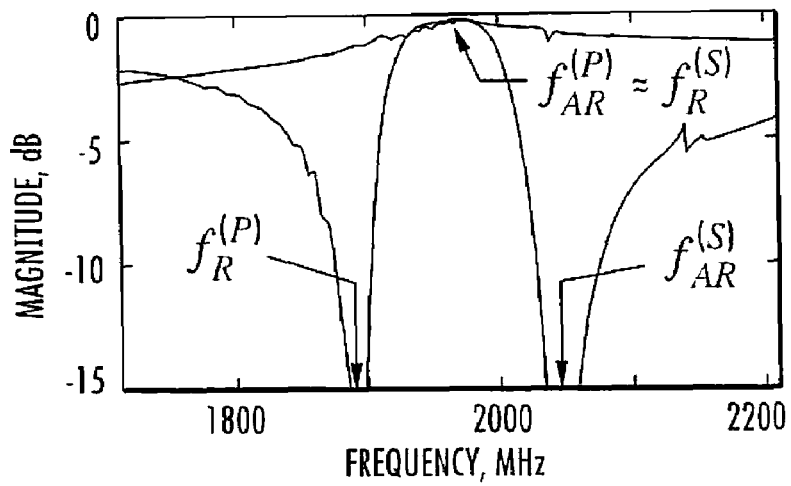
FIGS. 18A and 18B illustrate component response and resulting response characteristics, respectively, for a simple ladder filter illustrated with reference to FIG. 18C, wherein resonator frequencies are shifted slightly such that the series element resonance coincides with the parallel element antiresonance.
Figure 18B:
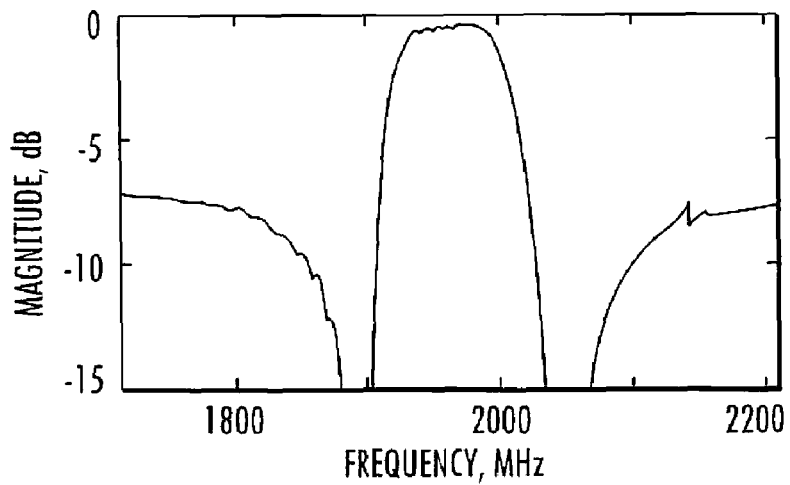
Figure 18C:
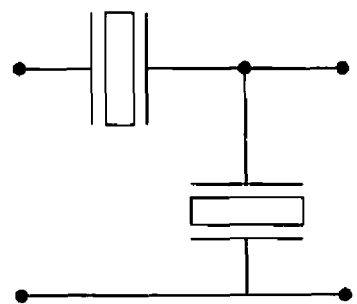

With regard to SAW structures in keeping with the teachings of the present invention, reference is now made to FIG. 15 illustrating one SAW resonator 10 comprising a SAW transducer 12 embedded between two reflective gratings 14, 16 forming an impedance element with distinctive resonant and anti-resonant frequency characteristics. By way of example, FIGS. 16A and 16B illustrate resonant and antiresonant frequency characteristics for an impedance element 18 in a series configuration, and a symbolic illustration of such series element, respectively. FIGS. 17A and 17B illustrate resonant and antiresonant frequency characteristics for the impedance element 18 in a parallel configuration, and a symbolic illustration of such parallel element, respectively. A combination of SAW resonators in a series and parallel configuration define a passband having characteristics as illustrated with reference to FIGS. 18A, 18B and 18C. A SAW filter can be formed by cascading several series and parallel SAW resonators 20, 22 in a ladder network as illustrated with reference to FIG. 19 for a ladder filter 24. To achieve a desired performance of system requirements, the filter performance desirably has a smooth response across the entire passband of the filter.

With reference again to FIG. 15, an embodiment of the present invention provides the SAW device 10 comprising a piezoelectric substrate 25 of a single crystal $LiNbO_3$ with an electrode pattern disposed on a surface of the piezoelectric substrate and forming a resonator. The resonator 10 comprises a SAW transducer 12 made up of metal electrodes 26 extending from two connecting bus bars 28, 30. The SAW transducer 12 is embedded between the gratings (reflective strips) 14, 16. As above described, the SAW resonator forms the impedance element 18 to be used as in series or parallel arms of the ladder filter 24. One ladder filter using the SAW resonators on the piezoelectric Lithium Niobate ($LiNbO_3$) substrate is as above referenced to FIG. 19. A thickness of an electrode pattern may range from 12% $\Lambda$ to 17.5% $\Lambda$. Al is used as a primary component of electrode material. Further, the piezoelectric substrate 25 includes an orientation defined by the Euler angles $(\lambda, \mu, \theta)$, with angle $\lambda$ in the range from $-5°$ to $+50$, angle $\mu$ in the range from $-74°$ to $-65°$, and angle $\theta$ in the range from $-5°$ to $+5°$. By way of one SAW ladder filter, reference is made to U.S. Pat. No. 6,833,774, the disclosure of which is herein incorporated by reference in its entirety.

Another embodiment of the present invention provides a SAW device which may comprise a piezoelectric substrate of a single crystal $LiNbO_3$ with an electrode pattern disposed on a surface of said piezoelectric substrate and forming resonator. A thickness of the electrode pattern ranges from 6% $\Lambda$ to 10% $\Lambda$. Cu may be used as a primary component of electrode material. The piezoelectric substrate 25 has an orientation defined by the Euler angles $(\lambda, \mu, \theta)$, with angle $\lambda$ in the range from $-5°$ to $+50$, angle $\mu$ in the range from $-65°$ to $-74°$, and angle $\theta$ in the range from $-5°$ to $+5°$.

By way of further example, one embodiment of a SAW device may comprise a piezoelectric substrate of a single crystal $LiNbO_3$ with an electrode pattern on a surface of the piezoelectric substrate, wherein the piezoelectric substrate has an orientation defined by Euler angles $(\lambda, \mu, \theta)$, with angle $\lambda$ in the range from $-5°$ to $5°$, angle $\mu$ in a range from about $-74°$ to about $-65°$, and angle $\theta$ in a range from about $-5°$ to $5°$, and wherein the electrode pattern forms a resonator having metallization ratio in a range from about 0.3 to about 0.8. Optionally, a primary material of the electrode may comprise Al, wherein an electrode thickness ranges from 12% $\Lambda$ to 17.5% $\Lambda$, where $\Lambda$ is an acoustic wavelength of a surface acoustic wave excited on a said piezoelectric substrate and having strong piezoelectric coupling, or a primary material of the electrode may comprise Cu, and wherein electrode thickness ranges from 6% $\Lambda$ to 10% $\Lambda$.

Embodiments of the present invention provide the filter with wide bandwidth and high performance, and reduce spurious resonance caused by parasitic SAW mode. By way of example and as herein described, SAW filters may comprise resonator-type elements, built on an optimal orientation of $LiNbO_3$ with Al or Cu grating of optimal thickness. The high performance of a wideband filter is provided due to high electromechanical coupling of Mode 1 and minimum coupling of Mode 2. Further, temperature compensated versions of these SAW filters may be provided. By way of example, the temperature compensation may be accomplished by bonding of $LiNbO_3$ wafer of optimal orientation, with optimal thickness of Al or Cu grating, to silicon, glass, Pyrex or another material 32, to obtain composite wafer with improved temperature stability, as illustrated with reference again to FIG. 19. With continued reference to FIG. 19, and as above described, an acoustic absorbing material 34 may be placed adjacent (on the bus bars, adjacent the reflectors, and the like) the acoustically active area 36.

It is to be understood that even though numerous characteristics and advantages of the present invention have been set forth in the foregoing description, together with details of the structure and function of the invention, the disclosure is illustrative only, and changes may be made in detail, especially in the choice of type of SAW device, device orientation on the die, and shape size and arrangement of parts within the principles of the invention to the full extent indicated by the broad general meaning of the terms in which the appended claims are expressed.

Figure 20:
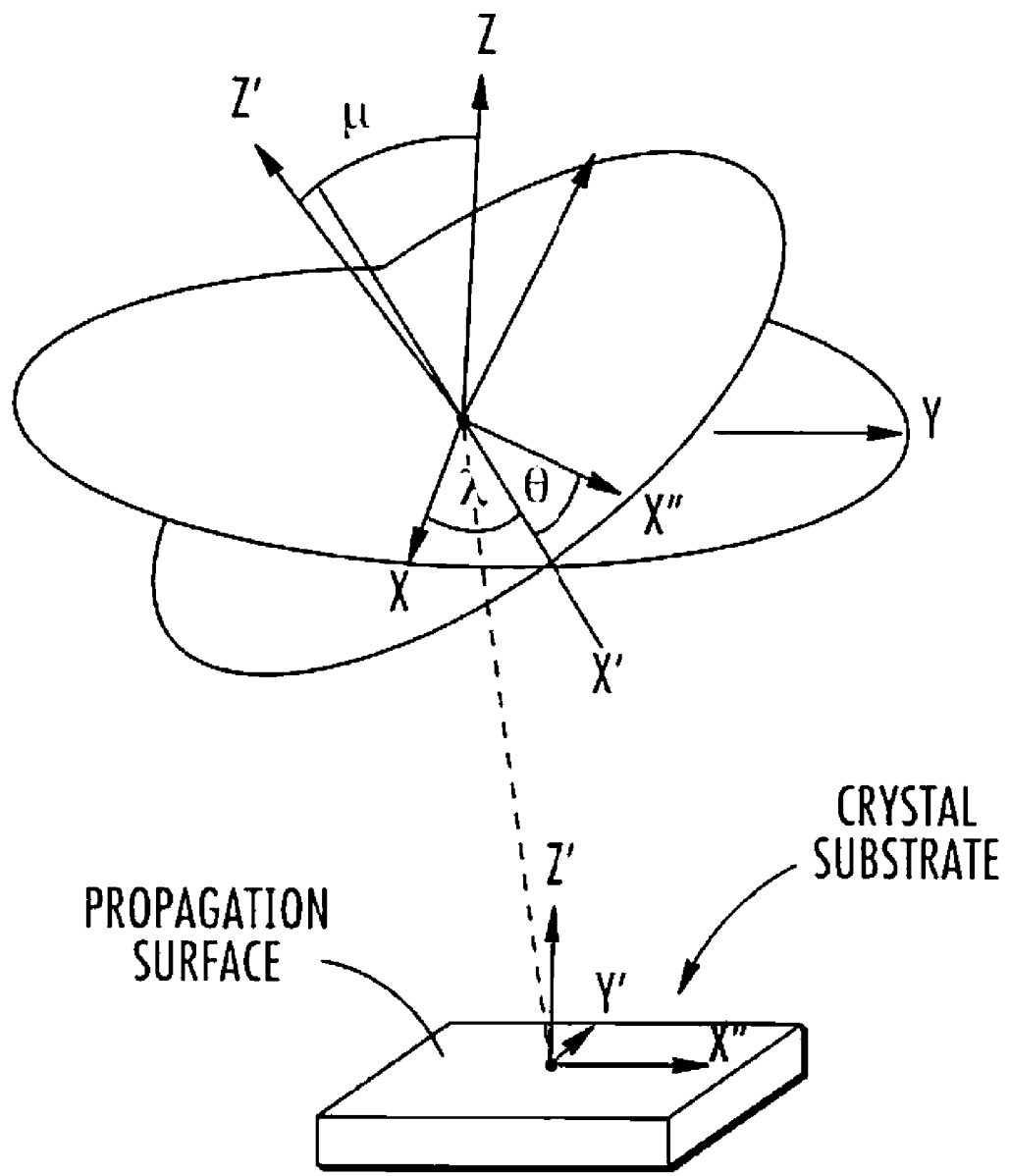
FIG. 20 diagrammatically illustrates an orientation of a crystal plane and a propagation direction in the plane using Euler angles with reference to initial crystal axes X, Y, and Z.

By way of explanation regarding the angle convention herein used to describe crystal orientations, reference is made to FIG. 20 for considering an orientation procedure defining a substrate cut and propagation direction of LSAW within this cut according to the specified Euler angles ($\lambda$, $\mu$, $\theta$). With initial coordinate axes X, Y, Z fixed along crystal axes of a crystal substrate according to the Euler angle convention, first, auxiliary axis X' (positive direction) is obtained by rotation from positive X axis towards positive Y axis by the angle $\lambda$. The outward normal to the substrate cut Z' is then found by rotation about auxiliary axis X' from positive Z axis, by the angle $\mu$ counter-clockwise, as viewed from positive X'. Finally, the direction of surface wave propagation X" on propagation surface is found by rotation about Z' from positive X' axis by the angle $\theta$ counterclockwise, as viewed from positive Z' axis. Reference is also made to U.S. Pat. Nos. 6,661,313 and 6,556,104 describing SAW devices using optimum cuts of piezoelectric substrates, the disclosures of which are herein incorporated by reference in their entirety.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of claims herein presented.

That which is claimed is:

1. A surface acoustic wave device comprising:
a piezoelectric substrate of a LiNbO$_3$ single crystal, the piezoelectric substrate having an orientation defined by Euler angles ($\lambda$, $\mu$, $\theta$), with angle $\lambda$ ranging from $-5°$ to $+5°$, angle $\mu$ ranging from $-74°$ to $-65°$, and angle $\theta$ ranging from $-5°$ to $+5°$; and
an electrode pattern forming a resonator having a plurality of electrodes disposed on a surface of the piezoelectric substrate,
wherein the electrodes are at least one of Aluminum as a primary component with a thickness of the electrodes ranging from about 12% $\Lambda$ to 17.5% $\Lambda$ and Copper as a primary component with a thickness of the electrodes ranging from about 6% $\Lambda$ to 10% $\Lambda$, with $\Lambda$ defined as an acoustic wavelength of a surface acoustic wave excited on the surface of the piezoelectric substrate.

2. A device according to claim 1, wherein the Euler angles ($\lambda$, $\mu$, $\theta$) include angle $\lambda$ equal to about 0°, angle $\mu$ equal to about $-71°\pm/-3°$, and angle $\theta$ equal to about 0°.

3. A device according to claim 1, wherein the Aluminum electrodes have a thickness of about 15.5% $\Lambda$, and the Copper electrodes have a thickness of about 7.9% $\Lambda$.

4. A device according to claim 1, wherein the electrode pattern forms a resonator having a metallization ratio in a range from about 0.3 to about 0.8.

5. A device according to claim 1, further comprising the piezoelectric substrate bonded to a material for providing temperature stability.

6. A device according to claim 5, wherein the material comprises at least one of silicon, glass, and Pyrex.

7. A device according to claim 1, further comprising an acoustic absorbing material covering an acoustically active area of the resonator.

8. A device according to claim 7, wherein the acoustic absorbing material comprises an organic compound.

9. A device according to claim 8, wherein the organic compound is at least one of a plastic, a photoresist material, and an epoxy.

10. A surface acoustic wave device comprising:
a piezoelectric substrate of a LiNbO$_3$ single crystal, the piezoelectric substrate having an orientation defined by Euler angles ($\lambda$, $\mu$, $\theta$), with angle $\lambda$ ranging from $-5°$ to $+5°$, angle $\mu$ ranging from $-74°$ to $-65°$, and angle $\theta$ ranging from $-5°$ to $+5°$; and
a plurality of electrodes disposed on a surface of the piezoelectric substrate, wherein the electrodes include Aluminum as a primary component with a thickness ranging from about 12% $\Lambda$ to 17.5% $\Lambda$, with $\Lambda$ defined as an acoustic wavelength of a surface acoustic wave excited on the surface of the piezoelectric substrate.

11. A surface acoustic wave device comprising:
a piezoelectric substrate of a LiNbO$_3$ single crystal, the piezoelectric substrate having an orientation defined by Euler angles ($\lambda$, $\mu$, $\theta$), with angle $\lambda$ ranging from $-5°$ to $+5°$, angle $\mu$ ranging from $-74°$ to $-65°$, and angle $\theta$ ranging from $-5°$ to $+5°$; and
a plurality of electrodes disposed on a surface of the piezoelectric substrate, wherein the electrodes include Copper as a primary component with a thickness ranging from about 6% $\Lambda$ to 10% $\Lambda$, with $\Lambda$ defined as an acoustic wavelength of a surface acoustic wave excited on the surface of the piezoelectric substrate.

12. A surface acoustic wave device comprising:
a piezoelectric substrate of a LiNbO$_3$ single crystal, the piezoelectric substrate having an orientation defined by Euler angles ($\lambda$, $\mu$, $\theta$), with angle $\lambda$ ranging from $-5°$ to $+5°$, angle $\mu$ ranging from $-74°$ to $-65°$, and angle $\theta$ ranging from $-5°$ to $+50$; and
an electrode pattern forming a plurality of resonators disposed on a surface of the piezoelectric substrate, the plurality of resonators being arranged in a series arm and a parallel arm so as to form a ladder filter thereon,
wherein electrodes within each of the plurality of resonators are at least one of Aluminum as a primary component with a thickness of the electrodes ranging from about 12% $\Lambda$ to 17.5% $\Lambda$ and Copper as a primary component with a thickness of the electrodes ranging from about 6% $\Lambda$ to 10% $\Lambda$, with $\Lambda$ defined as an acoustic wavelength of a surface acoustic wave excited on the surface of the piezoelectric substrate.

13. A device according to claim 12, wherein the Euler angles ($\lambda$, $\mu$, $\theta$) include angle $\lambda$ equal to about 0°, angle $\mu$ equal to about $-71°+/-3°$, and angle $\theta$ equal to about 0°.

14. A device according to claim 12, wherein the Aluminum electrodes have a thickness of about 15.5% $\Lambda$, and the Copper electrodes have a thickness of about 7.9% $\Lambda$.

15. A device according to claim 12, wherein the electrode pattern forms a resonator having a metallization ratio in a range from about 0.3 to about 0.8.

* * * * *